US012597914B2

(12) United States Patent  
Cho et al.

(10) Patent No.: US 12,597,914 B2  
(45) Date of Patent: Apr. 7, 2026

(54) OSCILLATING SIGNAL GENERATING CIRCUIT AND A SEMICONDUCTOR APPARATUS USING THE SAME

(71) Applicant: SK hynix Inc., Icheon-si (KR)

(72) Inventors: Sun Ki Cho, Icheon-si (KR); Yang Ho Sur, Icheon-si (KR); Ic Su Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 52 days.

(21) Appl. No.: 18/810,138

(22) Filed: Aug. 20, 2024

(65) Prior Publication Data

US 2024/0413814 A1    Dec. 12, 2024

Related U.S. Application Data

(62) Division of application No. 17/899,030, filed on Aug. 30, 2022, now Pat. No. 12,095,465.

(30) Foreign Application Priority Data

Apr. 13, 2022    (KR) ........................ 10-2022-0045797

(51) Int. Cl.  
*H03K 5/01* (2006.01)  
*H03K 5/00* (2006.01)

(52) U.S. Cl.  
CPC ..... *H03K 5/01* (2013.01); *H03K 2005/00078* (2013.01)

(58) Field of Classification Search  
CPC .. H03K 5/01; H03K 2005/00078; H03K 5/00; H03K 2005/00013; H03K 5/134; G11C 7/222; H03L 7/0814

USPC .......................................................... 327/261  
See application file for complete search history.

(56) References Cited

U.S. PATENT DOCUMENTS

| | | | | |
|---|---|---|---|---|
| 6,265,916 B1 * | 7/2001 | Ono | ........................ | H03L 7/181 |
| | | | | 327/119 |
| 6,958,658 B2 * | 10/2005 | Shah | .................... | H03K 3/0315 |
| | | | | 455/76 |
| 7,705,687 B1 | 4/2010 | Paz | | |
| 9,503,059 B1 | 11/2016 | Margarit | | |
| 12,095,465 B2 * | 9/2024 | Cho | ........................ | H03K 5/01 |
| 2002/0145456 A1 * | 10/2002 | Kikuchi | .................. | H03L 7/199 |
| | | | | 327/156 |
| 2004/0085111 A1 * | 5/2004 | Yi | ........................ | H03K 5/1565 |
| | | | | 327/175 |
| 2007/0103183 A1 | 5/2007 | Miller | | |
| 2009/0289673 A1 * | 11/2009 | Chiu | .................... | H03L 7/0995 |
| | | | | 327/158 |

(Continued)

FOREIGN PATENT DOCUMENTS

| | | |
|---|---|---|
| KR | 1020100052079 A | 5/2010 |
| KR | 101046274 B1 | 7/2011 |

(Continued)

*Primary Examiner* — Ryan Jager  
(74) *Attorney, Agent, or Firm* — WILLIAM PARK AND ASSOCIATES LTD.

(57) ABSTRACT

An oscillating signal generating circuit drives an oscillating signal to a first logic level based on a first control signal, which is generated by delaying the oscillating signal through a clock delaying circuit, and drives the oscillating signal to a second logic level based on a second control signal, which is generated by delaying the oscillating signal by a fixed delay amount.

16 Claims, 12 Drawing Sheets

200

(56)          References Cited

U.S. PATENT DOCUMENTS

2012/0112812 A1\*   5/2012  Chen ......................... G06F 1/10
                                                          327/276
2023/0336166 A1\*  10/2023  Cho ......................... H03K 5/01
2024/0007111 A1\*   1/2024  El-halwagy .......... H03K 5/1565
2024/0413814 A1\*  12/2024  Cho ......................... H03K 5/01

FOREIGN PATENT DOCUMENTS

KR        1020200053219  A      5/2020
KR        1020200121522  A     10/2020

\* cited by examiner

<u>122</u>

<u>130</u>

DETERIORATION

<u>320</u>

<u>330</u>

OSCILLATING SIGNAL GENERATING CIRCUIT AND A SEMICONDUCTOR APPARATUS USING THE SAME

CROSS-REFERENCES TO RELATED APPLICATION

The present application is a divisional application of U.S. patent application Ser. No. 17/899,030, filed on Aug. 30, 2022, which claims priority under 35 U.S.C. § 119(a) to Korean application number 10-2022-0045797, filed on Apr. 13, 2022, in the Korean Intellectual Property Office, which applications are incorporated herein by reference in their entirety.

BACKGROUND

1. Technical Field

Various embodiments generally relate to an integrated circuit technology, and, more particularly, to an oscillating signal generating circuit and a semiconductor apparatus using the same.

2. Related Art

An electronic device includes a lot of electronic elements and a computer system as the electronic device includes lots of semiconductor apparatuses, each configured by a semiconductor. The semiconductor apparatuses configuring the computer system may communicate with each other by transmitting and receiving a clock signal and data. The semiconductor apparatuses may operate in synchronization with the clock signal. The clock signal may be generated from one of an oscillator, a phase locked loop circuit, and so forth.

The semiconductor apparatuses may perform various operations by receiving a system clock signal. In order to internally utilize the system clock signal, the semiconductor apparatuses may generate a plurality of internal clock signals from the system clock signal. The plurality of internal clock signals may be generated through frequency division of the system clock signal or through frequency increase of the system clock signal. The plurality of internal clock signal may be generated through a plurality of clock paths. In general, the plurality of clock paths may be designed to have the same elements and the same structure. However, the plurality of clock paths may have different delay amounts due to process variation or degradation. These different delay amounts may lead to a phase skew, among the plurality of internal clock signals, which may decrease a valid window or duration of a signal that is transferred in synchronization with the plurality of internal clock signals. Thus, each of the semiconductor apparatuses may have a configuration to correct the phase skew, among the plurality of internal clock signals.

SUMMARY

In an embodiment, an oscillating signal generating circuit may include a first clock delaying circuit, a timing control circuit, and an oscillating driver. The first clock delaying circuit may be configured to delay an oscillating signal to generate a first control signal. The timing control circuit may be configured to delay the oscillating signal by a fixed delay amount to generate a second control signal. The oscillating driver may be configured to drive the oscillating signal to a first logic level based on the first control signal and configured to drive the oscillating signal to a second logic level based on the second control signal.

In an embodiment, an oscillating signal generating circuit may include a first clock delaying circuit, a first timing control circuit, a second timing control circuit, and an oscillating driver. The first clock delaying circuit may be configured to delay an oscillating signal. The first timing control circuit may be configured to receive an output signal from the first clock delaying circuit to generate a first control signal. The second timing control circuit may be configured to delay the oscillating signal by a fixed delay amount to generate a second control signal. The oscillating driver may be configured to drive the oscillating signal to a first logic level based on the first control signal and configured to drive the oscillating signal to a second logic level based on the second control signal.

In an embodiment, an oscillating signal generating circuit may include a first clock delaying circuit, a second clock delaying circuit, a selecting circuit, a timing control circuit, and an oscillating driver. The first clock delaying circuit may be configured to delay an oscillating signal. The second clock delaying circuit may be configured to delay the oscillating signal. The selecting circuit may be configured to output of output signal from the first clock delaying circuit and an output signal from the second clock delaying circuit as a first control signal based on a selection signal. The timing control circuit may be configured to delay the oscillating signal by a fixed delay amount to generate a second control signal. The oscillating driver may be configured to generate the oscillating signal based on the first control signal and the second control signal.

In an embodiment, an oscillating signal generating circuit may include a first clock delaying circuit, a set pulse generating circuit, a reset pulse generating circuit, and an oscillating driver. The first clock delaying circuit may be configured to delay an oscillating signal. The set pulse generator may be configured to generate, based on an output from the first clock delaying circuit, a set pulse signal that is synchronized with one of a rising edge and a falling edge of the oscillating signal. The reset pulse generator may be configured to receive the set pulse signal and configured to generate a reset pulse signal. The oscillating driver may be configured to drive the oscillating signal to a first logic level based on the set pulse signal and configured to drive the oscillating signal to a second logic level based on the reset pulse signal.

In an embodiment, an oscillating signal generating circuit may include a first clock delaying circuit, a second clock delaying circuit, a selecting circuit, a set pulse generator, a reset pulse generating circuit, and an oscillating driver. The first clock delaying circuit may be configured to delay an oscillating signal. The second clock delaying circuit may be configured to delay the oscillating signal. The selecting circuit may be configured to output one of an output signal from the first clock delaying circuit and an output signal from the second clock delaying circuit based on a selection signal. The set pulse generator may be configured to receive the output signal from the selecting circuit and configured to generate a set pulse signal that is synchronized with one of a rising edge and a falling edge of the oscillating signal. The reset pulse generator may be configured to generate a reset pulse signal based on the set pulse signal. The oscillating driver may be configured to generate the oscillating signal based on the set pulse signal and the reset pulse signal.

In an embodiment, a semiconductor apparatus may include a first clock delaying circuit, a second clock delaying circuit, an oscillating control circuit, and a delay information generating circuit. The first clock delaying circuit may be configured to delay an oscillating signal to generate a first output clock signal. The second clock delaying circuit may be configured to delay, based on a delay control signal, the oscillating signal to generate a second output clock signal. The oscillating control circuit may be configured to control the oscillating signal to transition from a second logic level to a first logic level based on one of the first output clock signal and the second output clock signal and configured to control the oscillating signal to transition from the first logic level to the second logic level based on a signal that is generated by delaying the oscillating signal by a fixed delay amount. The delay information generating circuit may be configured to generate the delay control signal based on the oscillating signal that is generated through the first clock delaying circuit and the oscillating signal that is generated through the second clock delaying circuit.

In an embodiment, a semiconductor apparatus may include a first clock delaying circuit, a second clock delaying circuit, an oscillating control circuit, and a delay information generating circuit. The first clock delaying circuit may be configured to delay an oscillating signal to generate a first output clock signal. The second clock delaying circuit may be configured to delay, based on a delay control signal, the oscillating signal to generate a second output clock signal. The oscillating control circuit may be configured to generate, based on one of the first output clock signal and the second output clock signal, a set pulse signal to control the oscillating signal to transition from a second logic level to a first logic level and configured to generate, based on the set pulse signal, a reset pulse signal to control the oscillating signal to transition from the first logic level to the second logic level. The delay information generating circuit may be configured to generate the delay control signal based on the oscillating signal that is generated through the first clock delaying circuit and the oscillating signal that is generated through the second clock delaying circuit.

DETAILED DESCRIPTION

Figure 1:
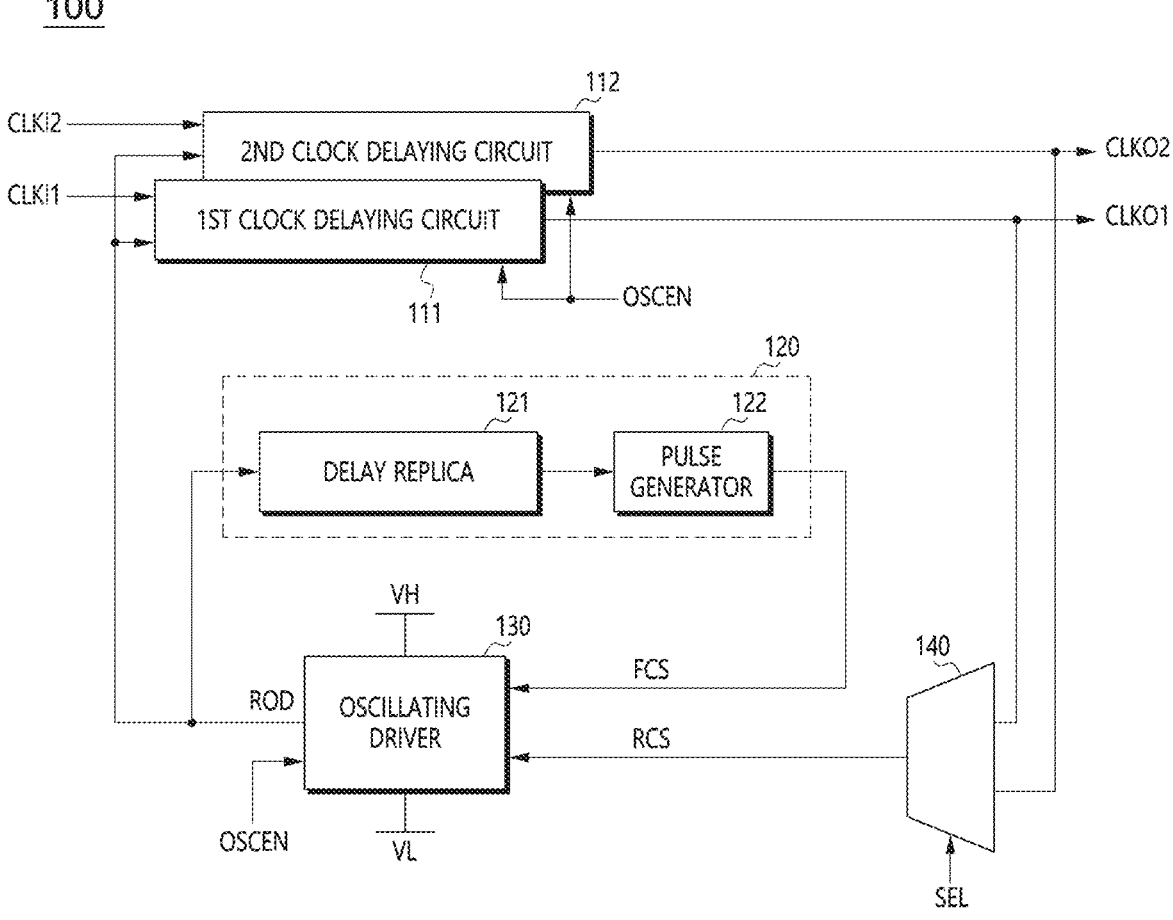
FIG. 1 is a diagram illustrating a configuration of an oscillating signal generating circuit in accordance with an embodiment.

FIG. 1 is a diagram illustrating a configuration of an oscillating signal generating circuit 100 in accordance with an embodiment. In order to monitor a delay amount of a clock delaying circuit, through which a clock signal propagates, the oscillating signal generating circuit 100 may generate an oscillating signal ROD through the clock delaying circuit. The oscillating signal generating circuit 100 may generate the oscillating signal ROD such that one of a rising edge and a falling edge of the oscillating signal ROD is in line with a consistent timing. On the other hand, the oscillating signal generating circuit 100 may generate the oscillating signal ROD such that the other edge of the rising and falling edges of the oscillating signal ROD is in line with a timing that varies according to the delay amount of the clock delaying circuit. The rising edge of the oscillating signal ROD may be a part of the oscillating signal ROD that transitions from a low logic level to a high logic level. The falling edge of the oscillating signal ROD may be a part of the oscillating signal ROD that transitions from a high logic level to a low logic level. For example, the oscillating signal generating circuit 100 may generate the falling edge of the oscillating signal ROD according to the delay amount of the clock delaying circuit and may generate the rising edge of the oscillating signal ROD when a fixed period of time elapses after when the falling edge is generated. In an embodiment, the oscillating signal generating circuit 100 may generate the rising edge of the oscillating signal ROD according to the delay amount of the clock delaying circuit and may generate the falling edge of the oscillating signal ROD when a fixed period of time elapses after the rising edge is generated. The oscillating signal generating circuit 100 may be sequentially coupled to a plurality of clock delaying circuits and may be configured to generate the oscillating signal ROD. The oscillating signal generating circuit 100 may generate the rising edge of the oscillating signal ROD when a fixed period of time elapses after the falling edge of the oscillating signal ROD is generated, and therefore, a period of the oscillating signal ROD may precisely include a delay amount skew among the plurality of clock delaying circuits, the delay amount skew being the difference between the actual delay amount and the intended delay amount of a clock delaying circuit.

Referring to FIG. 1, the oscillating signal generating circuit 100 may include a first clock delaying circuit 111, a timing control circuit 120, and an oscillating driver 130. The first clock delaying circuit 111 may receive the oscillating signal ROD to delay the oscillating signal ROD. The first clock delaying circuit 111 may provide the delayed oscillating signal as a first control signal RCS. In a normal mode, the first clock delaying circuit 111 may receive a first input clock signal CLKI1 and may delay the first input clock signal CLKI1 to generate a first output clock signal CLKO1.

In a compensation mode, the first clock delaying circuit 111 may receive the oscillating signal ROD and may delay the oscillating signal ROD to generate the first output clock signal CLKO1, providing the first output clock signal CLKO1 as the first control signal RCS. The first control signal RCS may be generated based on an edge of the oscillating signal ROD transitioning from a first logic level to a second logic level. The first control signal RCS may be generated when a period of time, corresponding to a delay amount of the first clock delaying circuit 111, elapses after the oscillating signal ROD transitions from the first logic level to the second logic level. The first logic level may be a low logic level and the second logic level may be a high logic level. In an embodiment, the first logic level may be a high logic level, and the second logic level may be a low logic level. The normal mode may be a mode in which the first clock delaying circuit 111 operates as a clock buffer. The compensation mode may be a mode, in which the delay amount by the first clock delaying circuit 111 is monitored. The normal mode and the compensation mode may be determined based on an enable signal OSCEN. When the enable signal OSCEN is disabled, the oscillating signal generating circuit 100 may operate in the normal mode, and the first clock delaying circuit 111 may delay the first input clock signal CLKI1 to generate the first output clock signal CLKO1. When the enable signal OSCEN is enabled, the oscillating signal generating circuit 100 may operate in the compensation mode, and the first clock delaying circuit 111 may delay the oscillating signal ROD to generate the first output clock signal CLKO1. The first clock delaying circuit 111 may be configured by a plurality of inverters or a plurality of logic gates, which are sequentially and serially coupled.

The timing control circuit 120 may receive the oscillating signal ROD. The timing control circuit 120 may delay the oscillating signal ROD by a fixed delay amount to generate a second control signal FCS. The timing control circuit 120 may generate the second control signal FCS based on an edge of the oscillating signal ROD transitioning from the second logic level to the first logic level. The timing control circuit 120 may generate the second control signal FCS when a period of time, corresponding to the fixed delay amount, elapses after the edge of the oscillating signal ROD transitioning from the second logic level to the first logic level is generated. The timing control circuit 120 may include a delay replica 121 and a pulse generator 122. The delay replica 121 may receive the oscillating signal ROD and may delay the oscillating signal ROD by the fixed delay amount. The delay replica 121 may be implemented by modelling the first clock delaying circuit 111. Therefore, in an ideal case, the delay replica 121 may have the same delay amount as the first clock delaying circuit 111. The pulse generator 122 may be coupled to the delay replica 121 and may receive an output signal from the delay replica 121. The pulse generator 122 may generate the second control signal FCS based on the output signal from the delay replica 121.

The oscillating driver 130 may receive the first control signal RCS and the second control signal FCS and may generate the oscillating signal ROD based on the first control signal RCS and the second control signal FCS. The oscillating driver 130 may drive the oscillating signal ROD to the first logic level based on the first control signal RCS and may drive the oscillating signal ROD to the second logic level based on the second control signal FCS. The oscillating driver 130 may control the oscillating signal ROD to transition from the second logic level to the first logic level when the first control signal RCS is enabled and may control the oscillating signal ROD to transition from the first logic level to the second logic level when the second control signal FCS is enabled. The oscillating driver 130 may receive a first power voltage VH and a second power voltage VL and may generate the oscillating signal ROD based on the first power voltage VH and the second power voltage VL. The first power voltage VH may have a higher voltage level than the second power voltage VL. The first power voltage VH may have a voltage level that is high enough to be regarded as a high logic level. The second power voltage VL may have a voltage level that is low enough to be regarded as a low logic level. The oscillating driver 130 may drive the oscillating signal ROD to the voltage level of the second power voltage VL based on the first control signal RCS and may drive the oscillating signal ROD to the voltage level of the first power voltage VH based on the second control signal FCS. The oscillating driver 130 may further receive the enable signal OSCEN. When the enable signal OSCEN is enabled, the oscillating driver 130 may be activated and may generate the oscillating signal ROD based on the first control signal RCS and the second control signal FCS. When the enable signal OSCEN is disabled, the oscillating driver 130 may be deactivated and may fix the oscillating signal ROD to a predetermined logic level regardless of the first control signal RCS and the second control signal FCS. For example, the oscillating driver 130 may disable the oscillating signal ROD.

The oscillating signal generating circuit 100 may further include a second clock delaying circuit 112 and a selecting circuit 140. The second clock delaying circuit 112 may receive the oscillating signal ROD to delay the oscillating signal ROD. In the normal mode, the second clock delaying circuit 112 may receive a second input clock signal CLKI2 and may delay the second input clock signal CLKI2 to generate a second output clock signal CLKO2. In the compensation mode, the second clock delaying circuit 112 may receive the oscillating signal ROD, delay the oscillating signal ROD to generate the second output clock signal CLKO2, and provide the second output clock signal CLKO2 to the selecting circuit 140. When the enable signal OSCEN is disabled, the oscillating signal generating circuit 100 may operate in the normal mode, and the second clock delaying circuit 112 may delay the second input clock signal CLKI2 to generate the second output clock signal CLKO2. When the enable signal OSCEN is enabled, the oscillating signal generating circuit 100 may operate in the compensation mode, and the second clock delaying circuit 112 may delay the oscillating signal ROD to generate the second output clock signal CLKO2. The second clock delaying circuit 112 may be configured by a plurality of inverters or a plurality of logic gates, which are sequentially and serially coupled. The second clock delaying circuit 112 may have substantially the same configuration as the first clock delaying circuit 111. The delay replica 121 may be implemented by modelling at least one of the first clock delaying circuit 111 and the second clock delaying circuit 112.

The selecting circuit 140 may be coupled to the first clock delaying circuit 111 and the second clock delaying circuit 112. The selecting circuit 140 may receive the first output clock signal CLKO1 and the second output clock signal CLKO2 as output signals from the first clock delaying circuit 111 and the second clock delaying circuit 112, respectively. The selecting circuit 140 may further receive a selection signal SEL. Based on the selection signal SEL, the selecting circuit 140 may output, as the first control signal RCS, one of the output signals from the first clock delaying circuit 111 and the second clock delaying circuit 112. In the compensation mode, the selection signal SEL may be a control signal for sequentially monitoring delay amounts of the first clock delaying circuit 111 and the second clock delaying circuit 112. For example, when the selection signal SEL has a first logic level, the selecting circuit 140 may output the first output clock signal CLKO1 as the first control signal RCS. When the selection signal SEL has a second logic level, the selecting circuit 140 may output the second output clock signal CLKO2 as the first control signal RCS. When the first output clock signal CLKO1 is selected by the selecting circuit 140, the oscillating signal generating circuit 100 may generate the oscillating signal ROD, which reflects a delay amount of the first clock delaying circuit 111. When the second output clock signal CLKO2 is selected by the selecting circuit 140, the oscillating signal generating circuit 100 may generate the oscillating signal ROD, which reflects a delay amount of the second clock delaying circuit 112. The selection signal SEL may be implemented by any control signal. For example, when the enable signal OSCEN is enabled and the oscillating signal generating circuit 100 operates in the compensation mode, an initial level of the selection signal SEL may be at the first logic level. When monitoring of the oscillating signal ROD generated by being coupled to the first clock delaying circuit 111 is completed, the logic level of the selection signal SEL may transition to the second logic level. The selection signal SEL may be initialized when the enable signal OSCEN is disabled.

Figure 2:
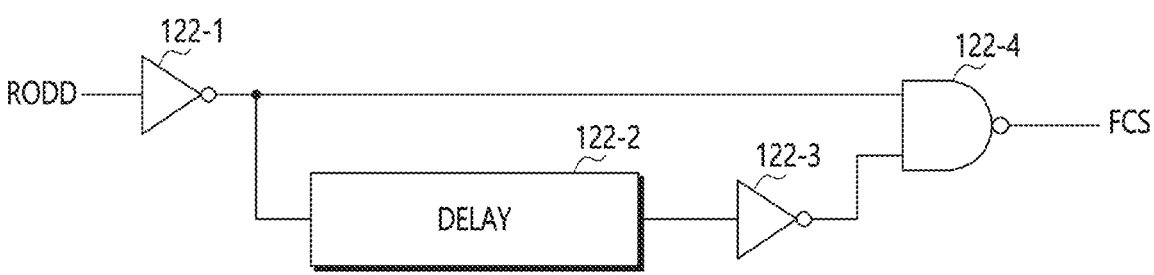
FIG. 2 is a diagram illustrating a pulse generator illustrated in FIG. 1.

FIG. 2 is a diagram illustrating the pulse generator 122, illustrated in FIG. 1. Referring to FIG. 2, the pulse generator 122 may include a first inverter 122-1, a delay 122-2, a second inverter 122-3, and a NAND gate 122-4. The first inverter 122-1 may receive the output signal from the delay replica 121 (see FIG. 1) to invert and drive the output signal from the delay replica 121. The delay 122-2 may receive an output from the first inverter 122-1 to delay the output from the first inverter 122-1. The second inverter 122-3 may receive an output from the delay 122-2 to invert and drive the output from the delay 122-2. The NAND gate 122-4 may receive the output from the first inverter 122-1 and an output from the second inverter 122-3 to output the second control signal FCS. When the output from the delay replica 121 transitions from a high logic level to a low logic level, the pulse generator 122 may generate, as the second control signal FCS, a pulse signal of a low logic level having a pulse width that corresponds to a delay amount of the delay 122-2.

Figure 3:
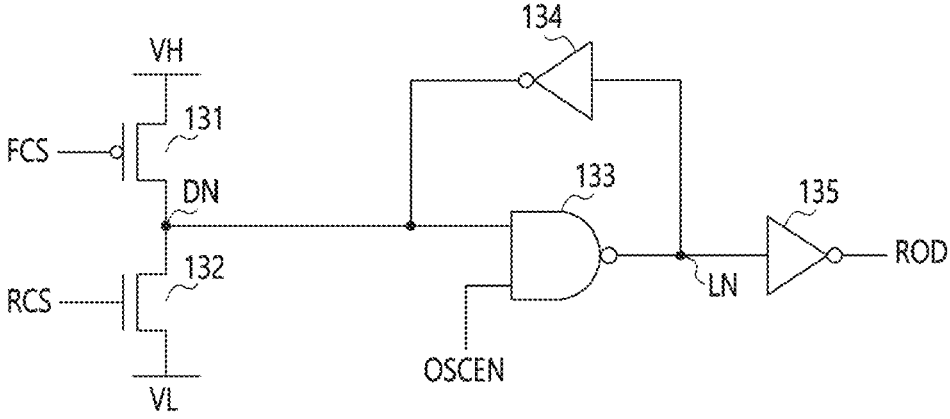
FIG. 3 is a diagram illustrating an oscillating driver illustrated in FIG. 1.

FIG. 3 is a diagram illustrating the oscillating driver 130, illustrated in FIG. 1. Referring to FIG. 3, the oscillating driver 130 may include a pull-up transistor 131, a pull-down transistor 132, a NAND gate 133, a first inverter 134, and a second inverter 135. Based on the second control signal FCS, the pull-up transistor 131 may drive a driving node DN to the first power voltage VH. The pull-up transistor 131 may be a P-channel MOS transistor. In an embodiment, the pull-up transistor 131 may be implemented by a N-channel MOS transistor. The pull-up transistor 131 may receive the first power voltage VH at its source and may be coupled to the driving node DN at its drain. The pull-up transistor 131 may receive the second control signal FCS at its gate. When the second control signal FCS is enabled to a low logic level, the pull-up transistor 131 may drive the driving node DN to the first power voltage VH. Based on the first control signal RCS, the pull-down transistor 132 may drive the driving node DN to the second power voltage VL. The pull-down transistor 132 may be a N-channel MOS transistor. The pull-down transistor 132 may be coupled to the driving node DN at its drain and may receive the second power voltage VL at its source. The pull-down transistor 132 may receive the first control signal RCS at its gate. When the first control signal RCS is enabled to a high logic level, the pull-down transistor 132 may drive the driving node DN to the second power voltage VL. The NAND gate 133 may be coupled to the driving node DN and may receive a signal from the driving node DN. The NAND gate 133 may receive the signal from the driving node DN and the enable signal OSCEN. When the enable signal OSCEN is enabled to a high logic level, the NAND gate 133 may invert and drive the signal from the driving node DN. An output of the NAND gate 133 may be coupled to a latching node LN. In an embodiment, the oscillating driver 130 might not receive the enable signal OSCEN, and the NAND gate 133 may be replaced with an inverter. The first inverter 134 may be coupled between the latching node LN and the driving node DN. The first inverter 134 may invert and drive a signal from the latching node LN and may output the inverted and driven signal to the driving node DN. The first inverter 134 may form, together with the NAND gate 133, an inversion latch and may maintain logic levels of the driving node DN and the latching node LN. The second inverter 135 may receive the signal from the latching node LN and may invert and drive the signal from the latching node LN to output the oscillating signal ROD.

Figure 4A:
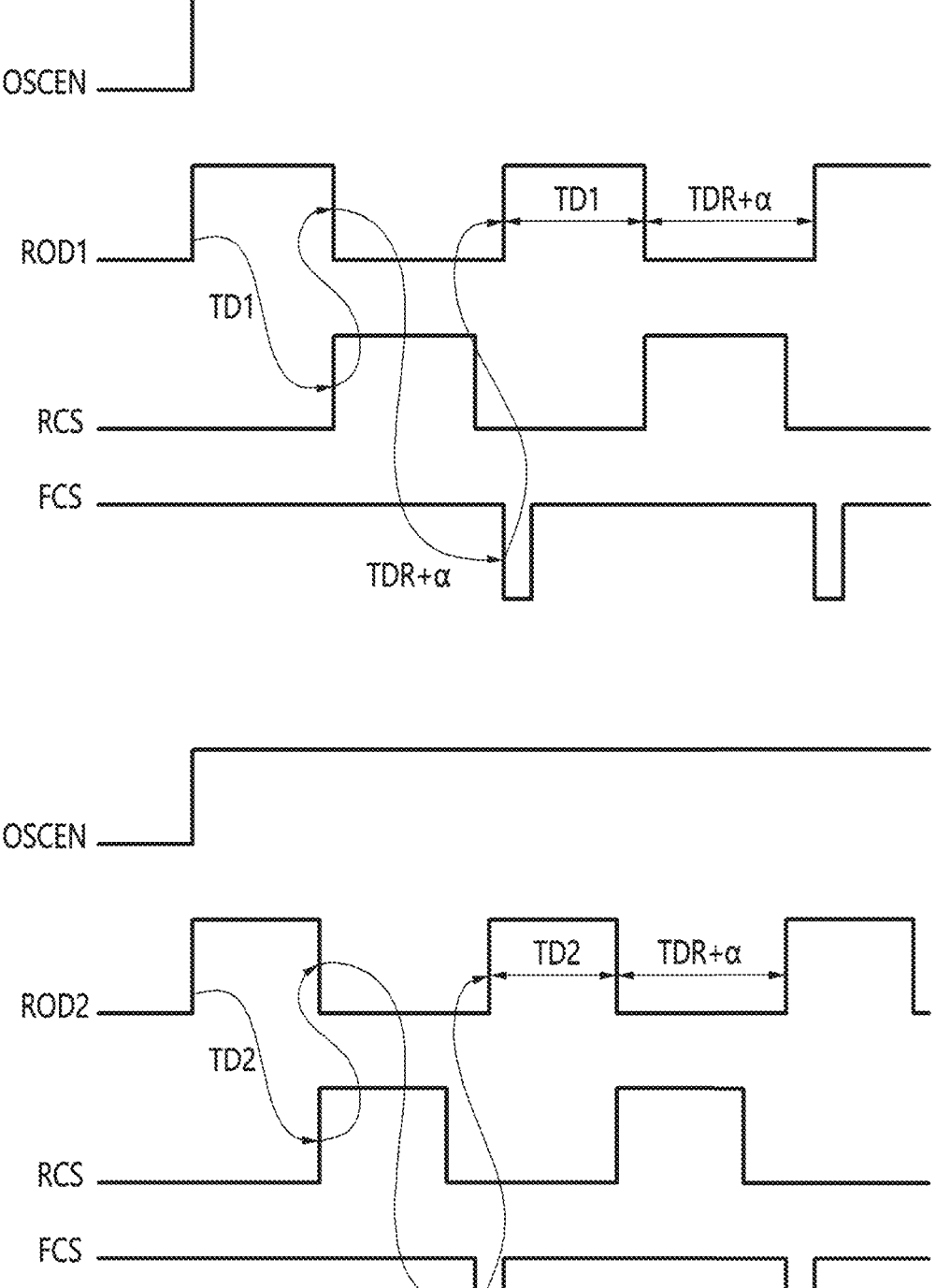
FIGS. 4A and 4B are timing diagrams illustrating an operation of an oscillating signal generating circuit in accordance with an embodiment.
Figure 4B:
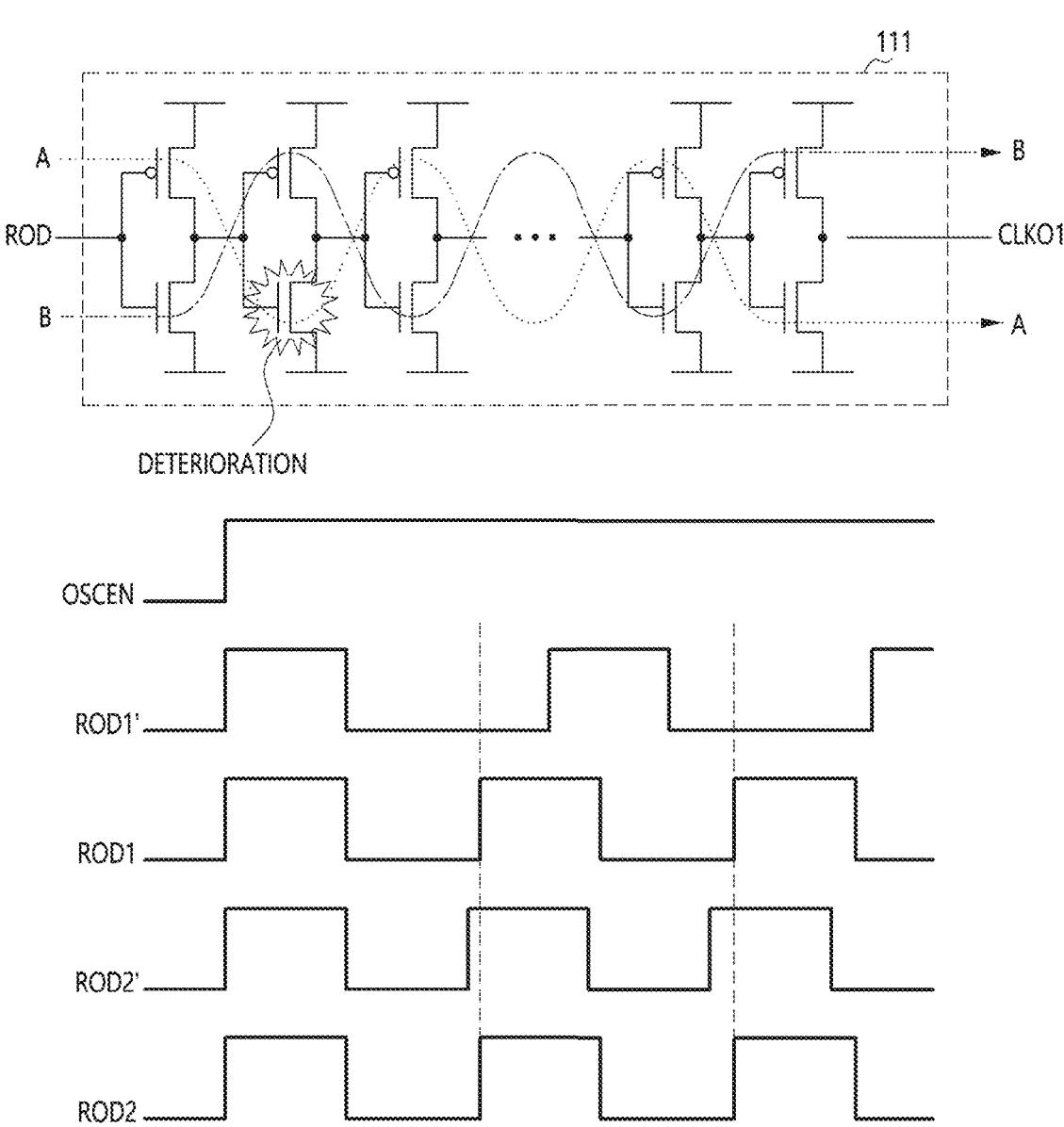

FIGS. 4A and 4B are timing diagrams illustrating an operation of the oscillating signal generating circuit 100 in accordance with an embodiment. Described hereinafter with reference to FIGS. 1 to 4B will be an operation of the oscillating signal generating circuit 100. Referring to FIG. 4A, when the enable signal OSCEN is enabled, the selection signal SEL may have a first logic level and the oscillating signal generating circuit 100 may generate the oscillating signal ROD through the first clock delaying circuit 111. For convenience of description, the oscillating signal ROD that is generated through the connection to the first clock delaying circuit 111 may be referred to as a first oscillating signal ROD1. The first clock delaying circuit 111 may delay the first oscillating signal ROD1 to generate the first output clock signal CLKO1. The selecting circuit 140 may provide the first output clock signal CLKO1 as the first control signal RCS. The first control signal RCS may be delayed, to be enabled to a high logic level, by a period of time that corresponds to a delay amount TD1 of the first clock delaying circuit 111 after the first oscillating signal ROD1 transitions from the low logic level to the high logic level. The first control signal RCS may stay enabled for a period of time that corresponds to a high-level pulse section of the first oscillating signal ROD1. Based on the first control signal RCS, the oscillating driver 130 may drive the driving node DN to the second power voltage VL to control the first oscillating signal ROD1 to transition from a high logic level to a low logic level. The NAND gate 133 and the first inverter 134 may maintain the logic level of the first oscillating signal ROD1 at a low logic level. Within the timing control circuit 120, the delay replica 121 may delay the first oscillating signal ROD1, and the pulse generator 122 may generate, based on the output from the delay replica 121, the second control signal FCS that transitions to a low logic level. The second control signal FCS may be delayed, to be enabled to a low logic level, by a period of time that corresponds to a delay amount TDR of the delay replica 121 and a period of time that corresponds to a delay amount α of the pulse generator 122 after the first oscillating signal ROD1 transitions from a high logic level to a low logic level. Based on the second control signal FCS, the oscillating driver 130 may drive the driving node DN to the first power voltage VH to control the first oscillating signal ROD1 to transition from a low logic level to a high logic level. The NAND gate 133 and the first inverter 134 may maintain the logic level of the first oscillating signal ROD1 at a high logic level. Therefore, a high-level pulse section of the first oscillating signal ROD1 may correspond to the delay amount TD1 of the first clock delaying circuit 111 and a low-level pulse section of the first oscillating signal ROD1 may correspond to the sum 'TDR+α' of the delay amount TDR of the delay replica 121 and the delay amount a of the pulse generator 122.

After the oscillating signal ROD is generated through the connection to the first clock delaying circuit 111, the selection signal SEL may change to have a second logic level and the oscillating signal generating circuit 100 may generate the oscillating signal ROD through the second clock delaying circuit 112. For convenience of description, the oscillating signal ROD that is generated through the connection to the second clock delaying circuit 112 may be referred to as a second oscillating signal ROD2. The second clock delaying circuit 112 may delay the second oscillating signal ROD2 to generate the second output clock signal CLKO2. The selecting circuit 140 may provide the second output clock signal CLKO2 as the first control signal RCS. The first control signal RCS may be delayed, to be enabled to a high logic level, by a period of time that corresponds to a delay amount TD2 of the second clock delaying circuit 112 after the second oscillating signal ROD2 transitions from the low logic level to the high logic level. The first control signal RCS may stay enabled for a period of time that corresponds to a high-level pulse section of the second oscillating signal ROD2. Based on the first control signal RCS, the oscillating driver 130 may drive the driving node DN to the second power voltage VL to control the second oscillating signal ROD2 to transition from a high logic level to a low logic level. The NAND gate 133 and the first inverter 134 may maintain the logic level of the second oscillating signal ROD2 at a low logic level. Within the timing control circuit 120, the delay replica 121 may delay the second oscillating signal ROD2, and the pulse generator 122 may generate, based on the output from the delay replica 121, the second control signal FCS that transitions to a low logic level. The second control signal FCS may be delayed, to be enabled to a low logic level, by a period of time that corresponds to delay amount TDR of the delay replica 121 and a period of time that corresponds to the delay amount a of the pulse generator 122 after the second oscillating signal ROD2 transitions from a high logic level to a low logic level. Based on the second control signal FCS, the oscillating driver 130 may drive the driving node DN to the first power voltage VH to control the second oscillating signal ROD2 to transition from a low logic level to a high logic level. The NAND gate 133 and the first inverter 134 may maintain the logic level of the second oscillating signal ROD2 at a high logic level. Therefore, a high-level pulse section of the second oscillating signal ROD2 may correspond to the delay amount TD2 of the second clock delaying circuit 112, and a low-level pulse section of the second oscillating signal ROD2 may correspond to the sum 'TDR+α' of the delay amount TDR of the delay replica 121 and the delay amount a of the pulse generator 122.

When comparing the first oscillating signal ROD1 and the second oscillating signal ROD2 with each other, the high-level pulse sections of the first oscillating signal ROD1 and the second oscillating signal ROD2 may vary based on the delay amount TD1 of the first clock delaying circuit 111 and the delay amount TD2 of the second clock delaying circuit 112, respectively, while each of the low-level pulse sections of the first oscillating signal ROD1 and the second oscillating signal ROD2 may be the same as the sum 'TDR+α' of the delay amounts of the delay replica 121 and the pulse generator 122. Therefore, a period of time between each of the first oscillating signal ROD1 and the second oscillating signal ROD2 transitioning to a low logic level and each of the first oscillating signal ROD1 and the second oscillating signal ROD2 transitioning to a high logic level may be consistent regardless of a delay amount skew between the first clock delaying circuit 111 and the second clock delaying circuit 112. In general, a semiconductor apparatus may be synchronized with at least one of a rising edge and a falling edge of a clock signal. For example, when the semiconductor apparatus is synchronized with the rising edge of the clock signal, a timing of the falling edge might not be more important than a timing of the rising edge. The oscillating signal generating circuit 100 may set the period of time between the oscillating signal ROD transitioning to a low logic level and the oscillating signal ROD transitioning to a high logic level, for the oscillating signal ROD, to be consistent in not including a timing skew between the falling edges of the first output clock signal CLKO1 and the second output clock signal CLKO2. On the other hand, the oscillating signal generating circuit 100 may set the period of time between the oscillating signal ROD transitioning to a high logic level and the oscillating signal ROD transitioning to a low logic level, for the oscillating signal ROD, to be variable according to the delay amounts of the first clock delaying circuit 111 and the second clock delaying circuit 112 to include only a timing skew between rising edges of the first output clock signal CLKO1 and the second output clock signal CLKO2.

Referring to FIG. 4B, when the first clock delaying circuit 111 is implemented by a plurality of inverters, a path A (illustrated with a dotted line) may be a path for generating a falling edge of the first output clock signal CLKO1 and a rising edge of the oscillating signal ROD, and a path B (illustrated with an alternate long and short dash line) may be a path for generating a rising edge of the first output clock signal CLKO1 and a falling edge of the oscillating signal ROD. A situation may arise in which a transistor deteriorates within the path A and no transistors deteriorate within the path B. In this situation, as illustrated in FIG. 4B, a first oscillating signal ROD1' that is generated according to a prior art may have a relatively short high-level section and a relatively long low-level section. On the other hand, according to an embodiment, the oscillating signal generating circuit 100 may generate the rising edge of the first oscillating signal ROD1 through the timing control circuit 120 including the delay replica 121. The second clock delaying circuit 112 might not deteriorate, and therefore, a second oscillating signal ROD2' that is generated according to a prior art may have high-level and low-level sections of substantially the same duration. On the other hand, according to an embodiment, the oscillating signal generating circuit 100 may generate the rising edge of the second oscillating signal ROD2 through the timing control circuit 120 including the delay replica 121. Therefore, according to an embodiment, even when the first clock delaying circuit 111 deteriorates, the periods of the first oscillating signal ROD1 and the second oscillating signal ROD2 may be substantially the same as each other. That is, even when a timing skew occurs between the falling edges due to the first clock delaying circuit 111 and the second clock delaying circuit 112, the oscillating signal generating circuit 100 might not include the timing skew between the falling edges in the oscillating signal ROD while including only the timing skew between the rising edges in the oscillating signal ROD. Therefore, the oscillating signal generating circuit 100 may precisely detect the timing skew between the rising edges due to the first clock delaying circuit 111 and the second clock delaying circuit 112 to effectively correct the phase skew of the first clock delaying circuit 111 and the second clock delaying circuit 112.

Figure 5:
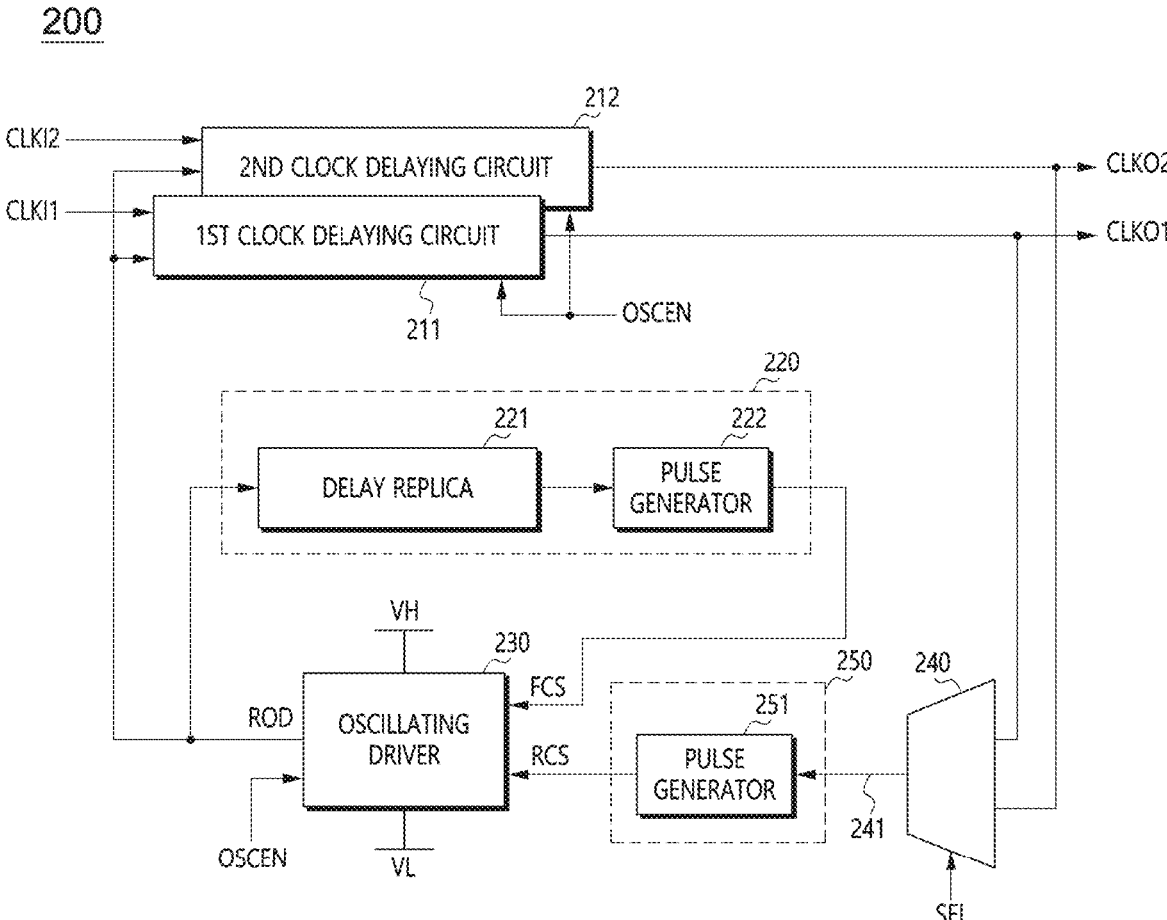
FIG. 5 is a diagram illustrating a configuration of an oscillating signal generating circuit in accordance with an embodiment.

FIG. 5 is a diagram illustrating a configuration of an oscillating signal generating circuit 200 in accordance with an embodiment. Referring to FIG. 5, the oscillating signal generating circuit 200 may include a first clock delaying circuit 211, a first timing control circuit 250, a second timing control circuit 220 and an oscillating driver 230. The second timing control circuit 220 may include a delay replica 221, and a first pulse generator 222. The first clock delaying circuit 211, the second timing control circuit 220 and the oscillating driver 230 may be substantially the same elements as the first clock delaying circuit 111, the timing control circuit 120, and the oscillating driver 130, illustrated in FIG. 1, respectively, and therefore, the description for the same elements will be omitted. The first timing control circuit 250 may receive the output signal from the first clock delaying circuit 211 to generate the first control signal RCS based on the output signal from the first clock delaying circuit 211. The first timing control circuit 250 may generate the first control signal RCS based on the edge of the oscillating signal ROD transitioning from the second logic level to the first logic level. The first timing control circuit 250 may include a second pulse generator 251. The second pulse generator 251 may receive the first output clock signal CLKO1 to generate the first control signal RCS based on the first output clock signal CLKO1. The oscillating signal generating circuit 200 may further include a second clock delaying circuit 212 and a selecting circuit 240. The second clock delaying circuit 212 and the selecting circuit 240 may be substantially the same elements as the second clock delaying circuit 112 and the selecting circuit 140, illustrated in FIG. 1, respectively. The first timing control circuit 250 may generate the first control signal RCS based on the output signal 241 from the selecting circuit 240. The oscillating signal generating circuit 100 (see FIG. 1) may provide, as the first control signal RCS, the oscillating signal ROD that is delayed by one of the first clock delaying circuit 111 and the second clock delaying circuit 112. The oscillating signal generating circuit 200 of FIG. 5 may generate the first control signal RCS, which is of a pulse type, from the oscillating signal ROD that is delayed by one of the first clock delaying circuit 211 and the second clock delaying circuit 212, which is similar to the second control signal FCS.

Figure 6:
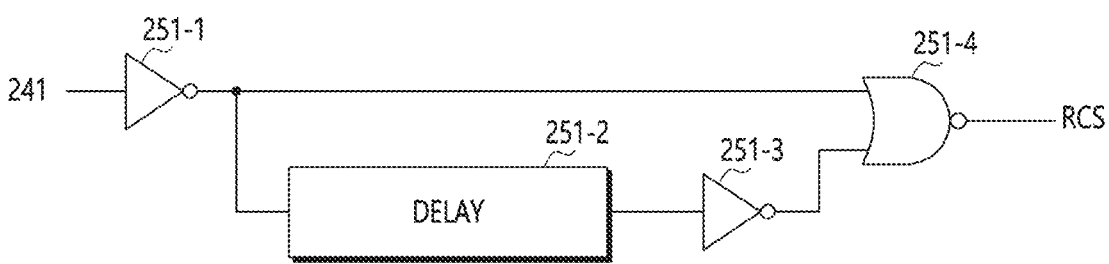
FIG. 6 is a diagram illustrating a pulse generator illustrated in FIG. 5.

FIG. 6 is a diagram illustrating the second pulse generator 251, illustrated in FIG. 5. Referring to FIG. 6, the second pulse generator 251 may include a first inverter 251-1, a delay 251-2, a second inverter 251-3, and a NOR gate 251-4. The first inverter 251-1 may receive the output signal 241 from the selecting circuit 240 to invert and drive the output signal 241 from the selecting circuit 240. The delay 251-2 may receive an output from the first inverter 251-1 to delay the output from the first inverter 251-1. The second inverter 251-3 may receive an output from the delay 251-2 to invert and drive the output from the delay 251-2. The NOR gate 251-4 may receive the output from the first inverter 251-1 and an output from the second inverter 251-3 to output the first control signal RCS. When the output signal 241 from the selecting circuit 240 transitions from a low logic level to a high logic level, the second pulse generator 251 may generate, as the first control signal RCS, a pulse signal of a high logic level having a pulse width that corresponds to a delay amount of the delay 251-2.

Figure 7:
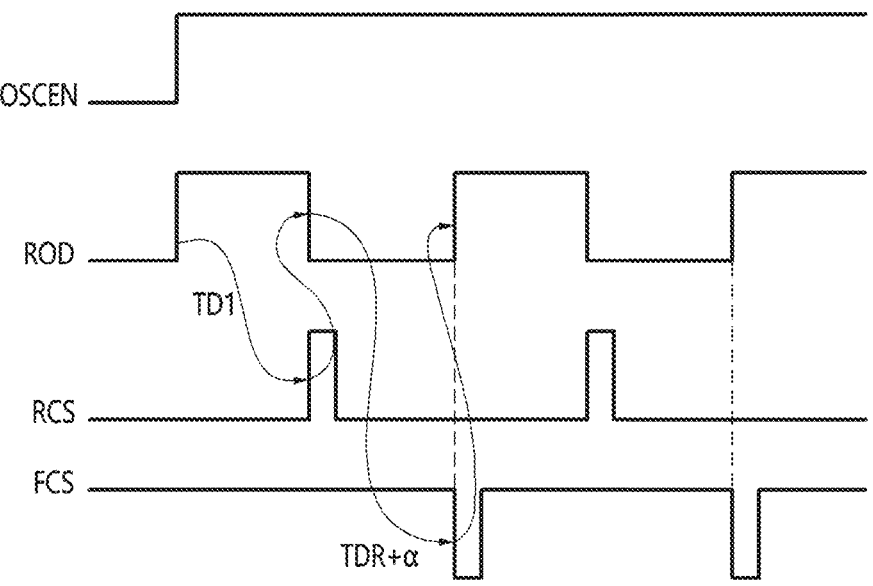
FIG. 7 is a timing diagram illustrating an operation of an oscillating signal generating circuit in accordance with an embodiment.

FIG. 7 is a timing diagram illustrating an operation of an oscillating signal generating circuit 200, illustrated in FIG. 6, in accordance with an embodiment. Described hereinafter with reference to FIGS. 6 and 7 will be an operation of the oscillating signal generating circuit 200. When the enable signal OSCEN is enabled, the selection signal SEL may have a first logic level, and the oscillating signal generating circuit 200 may generate the oscillating signal ROD through the first clock delaying circuit 211. The first clock delaying circuit 211 may delay the oscillating signal ROD to generate the first output clock signal CLKO1. The selecting circuit 240 may provide the first timing control circuit 250 with the first output clock signal CLKO1 as the output signal 241. The first timing control circuit 250 may generate the first control signal RCS that is enabled to a high logic level when a period of time, corresponding to the delay amount TD1 of the first clock delaying circuit 211, elapses after the oscillating signal ROD transitions from the low logic level to the high logic level. The first control signal RCS may be enabled in a pulse form by the second pulse generator 251. Based on the first control signal RCS, the oscillating driver 230 may control the oscillating signal ROD to transition from a high logic level to a low logic level. Within the second timing control circuit 220, the delay replica 221 may delay the oscillating signal ROD, and the first pulse generator 222 may generate, based on an output from the delay replica 221, the second control signal FCS that transitions to a low logic level. The second control signal FCS may be delayed, to be enabled to a low logic level, by a period of time that corresponds to the delay amount TDR of the delay replica 221 and a period of time that corresponds to the delay amount a of the first pulse generator 222 after the oscillating signal ROD transitions from a high logic level to a low logic level. Based on the second control signal FCS, the oscillating driver 230 may control the oscillating signal ROD to transition from a low logic level to a high logic level. Therefore, a high-level pulse section of the oscillating signal ROD may correspond to the delay amount TD1 of the first clock delaying circuit 211, and a low-level pulse section of the oscillating signal ROD may correspond to the sum 'TDR+α' of the delay amount TDR of the delay replica 221 and the delay amount a of the first pulse generator 222. When the output signals from the first clock delaying circuit 111 and the second clock delaying circuit 112 are provided directly as the first control signal RCS, as illustrated in FIG. 1, there may be a restriction to set the delay amount TDR of the delay replica 121. When the delay amount TDR of the delay replica 121 is less than the delay amount of the first clock delaying circuit 111 or the second clock delaying circuit 112, a situation may arise in which the second control signal FCS is enabled before the first control signal RCS is disabled. When the enabled sections of the first control signal RCS and the second control signal FCS overlap each other, it may be hard for the oscillating driver 130 to normally drive the oscillating signal ROD. However, the first timing control circuit 250 (see FIG. 5) may generate the oscillating signal ROD having a pulse form, which is the same as the second control signal FCS, and therefore, the delay amount TDR of the delay replica 221 may be removed or reduced based on the restriction that is set.

Figure 8:
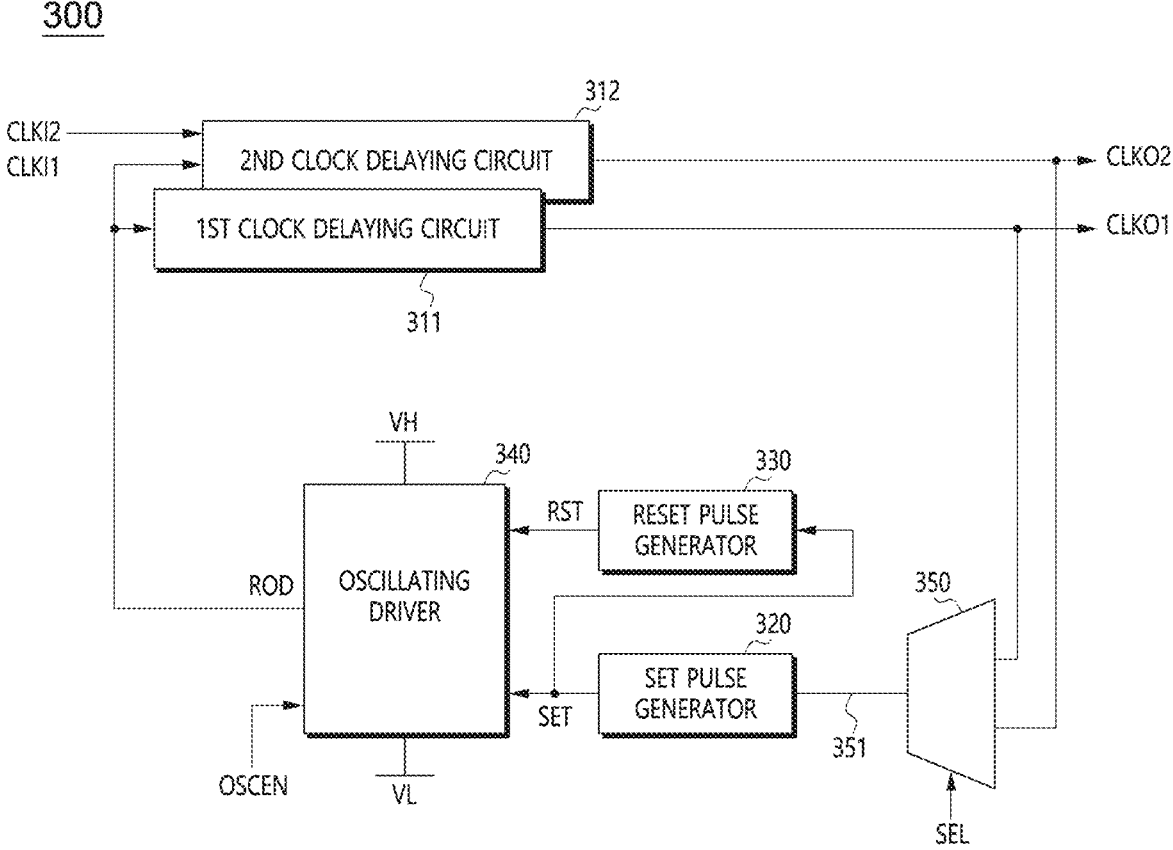
FIG. 8 is a diagram illustrating a configuration of an oscillating signal generating circuit in accordance with an embodiment.

FIG. 8 is a diagram illustrating a configuration of an oscillating signal generating circuit 300 in accordance with an embodiment. Referring to FIG. 8, the oscillating signal generating circuit 300 may include a first clock delaying circuit 311, a set pulse generator 320, a reset pulse generator 330, and an oscillating driver 340. The first clock delaying circuit 311 may be substantially the same element as the first clock delaying circuit 111, illustrated in FIG. 1, and therefore, the description on the first clock delaying circuit 311 will be omitted. The set pulse generator 320 may receive the output signal from the first clock delaying circuit 311 and may generate a set pulse signal SET based on the output signal from the first clock delaying circuit 311. The set pulse generator 320 may generate, based on the output signal from the first clock delaying circuit 311, the set pulse signal SET that is synchronized with one of the rising and falling edges of the oscillating signal ROD. For example, the set pulse generator 320 may receive the output signal from the first clock delaying circuit 311 to generate the set pulse signal SET based on an edge of the oscillating signal ROD transitioning from a first logic level to a second logic level. The set pulse generator 320 may generate the set pulse signal SET when a period of time, corresponding to the delay amount of the first clock delaying circuit 311, elapses after the edge of the oscillating signal ROD is generated. The reset pulse generator 330 may receive the set pulse signal SET from the set pulse generator 320. The reset pulse generator 330 may generate a reset pulse signal RST based on the set pulse signal SET. The reset pulse generator 330 may enable the reset pulse signal RST when the set pulse signal SET is disabled.

The oscillating driver 340 may receive the set pulse signal SET and the reset pulse signal RST and may generate the oscillating signal ROD based on the set pulse signal SET and the reset pulse signal RST. The oscillating driver 340 may drive the oscillating signal ROD to the first logic level based on the set pulse signal SET and may drive the oscillating signal ROD to the second logic level based on the reset pulse signal RST. The oscillating driver 340 may control the oscillating signal ROD to transition from the second logic level to the first logic level when the set pulse signal SET is enabled and to transition from the first logic level to the second logic level when the reset pulse signal RST is enabled. The oscillating driver 340 may receive a first power voltage VH and a second power voltage VL and may generate the oscillating signal ROD based on the first power voltage VH and the second power voltage VL. The oscillating driver 340 may drive the oscillating signal ROD to a voltage level of the second power voltage VL based on the set pulse signal SET and may drive the oscillating signal ROD to a voltage level of the first power voltage VH based on the reset pulse signal RST. The oscillating driver 340 may further receive the enable signal OSCEN. When the enable signal OSCEN is enabled, the oscillating driver 340 may be activated to generate the oscillating signal ROD based on the set pulse signal SET and the reset pulse signal RST. When the enable signal OSCEN is disabled, the oscillating driver 340 may be deactivated to fix the oscillating signal ROD to a predetermined logic level regardless of the set pulse signal SET and the reset pulse signal RST. The oscillating driver 340 may have substantially the same configuration as the oscillating driver 130, illustrated in FIG. 3, except that the oscillating driver 340 receives the set pulse signal SET instead of the first control signal RCS and receives the reset pulse signal RST instead of the second control signal FCS.

The oscillating signal generating circuit 300 may further include a second clock delaying circuit 312 and a selecting circuit 350. The second clock delaying circuit 312 and the selecting circuit 350 may be substantially the same elements as the second clock delaying circuit 112 and the selecting circuit 140, illustrated in FIG. 1, respectively, and therefore, the description for the same elements will be omitted. When the oscillating signal generating circuit 300 includes the selecting circuit 350, the set pulse generator 320 may receive the output signal 351 from the selecting circuit 350 and may generate the set pulse signal SET based on the output signal 351 from the selecting circuit 350. According to the oscillating signal generating circuit 300, a timing to generate the set pulse signal SET may depend on the delay amounts of the first clock delaying circuit 311 and the second clock delaying circuit 312 while a timing to enable the reset pulse signal RST may be consistently a timing to disable the set pulse signal SET. Therefore, the oscillating signal generating circuit 300 may generate the oscillating signal ROD, including therein only the timing skew between the rising edges due to the first clock delaying circuit 311 and the second clock delaying circuit 312, without including therein the timing skew between the falling edges due to the first clock delaying circuit 311 and the second clock delaying circuit 312.

Figure 9:
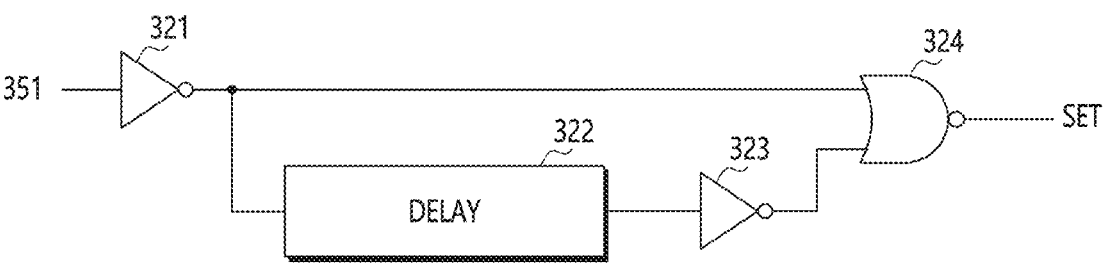
FIG. 9 is a diagram illustrating a set pulse generator illustrated in FIG. 8.

FIG. 9 is a diagram illustrating the set pulse generator 320, illustrated in FIG. 8. Referring to FIG. 9, the set pulse generator 320 may include a first inverter 321, a delay 322, a second inverter 323, and a NOR gate 324. The first inverter 321 may receive the output signal 351 from the selecting circuit 350 to invert and drive the output signal 351 from the selecting circuit 350. The delay 322 may receive an output from the first inverter 321 to delay the output from the first inverter 321. The second inverter 323 may receive an output from the delay 322 to invert and drive the output from the delay 322. The NOR gate 324 may receive the output from the first inverter 321 and an output from the second inverter 323 to output the set pulse signal SET. When the output signal 351 from the selecting circuit 350 transitions from a high logic level to a low logic level, the set pulse generator 320 may generate, as the set pulse signal SET, a pulse signal of a high logic level having a pulse width that corresponds to a delay amount of the delay 322.

Figure 10:
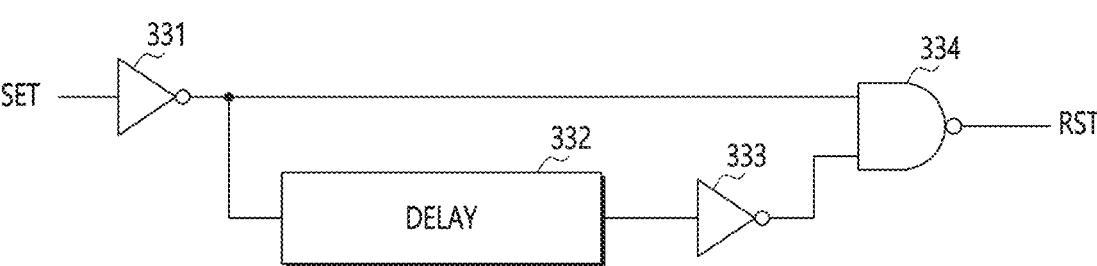
FIG. 10 is a diagram illustrating a reset pulse generator illustrated in FIG. 8.

FIG. 10 is a diagram illustrating the reset pulse generator 330, illustrated in FIG. 8. Referring to FIG. 10, the reset pulse generator 330 may include a first inverter 331, a delay 332, a second inverter 333 and a NAND gate 334. The first inverter 331 may receive the set pulse signal SET to invert and drive the set pulse signal SET. The delay 332 may receive an output from the first inverter 331 to delay the output from the first inverter 331. The second inverter 333 may receive an output from the delay 332 to invert and drive the output from the delay 332. The NAND gate 334 may receive the output from the first inverter 331 and an output from the second inverter 333 to output the reset pulse signal RST. When the set pulse signal SET transitions from a high logic level to a low logic level, the reset pulse generator 330 may generate, as the reset pulse signal RST, a pulse signal of a low logic level having a pulse width that corresponds to a delay amount of the delay 332.

Figure 11:
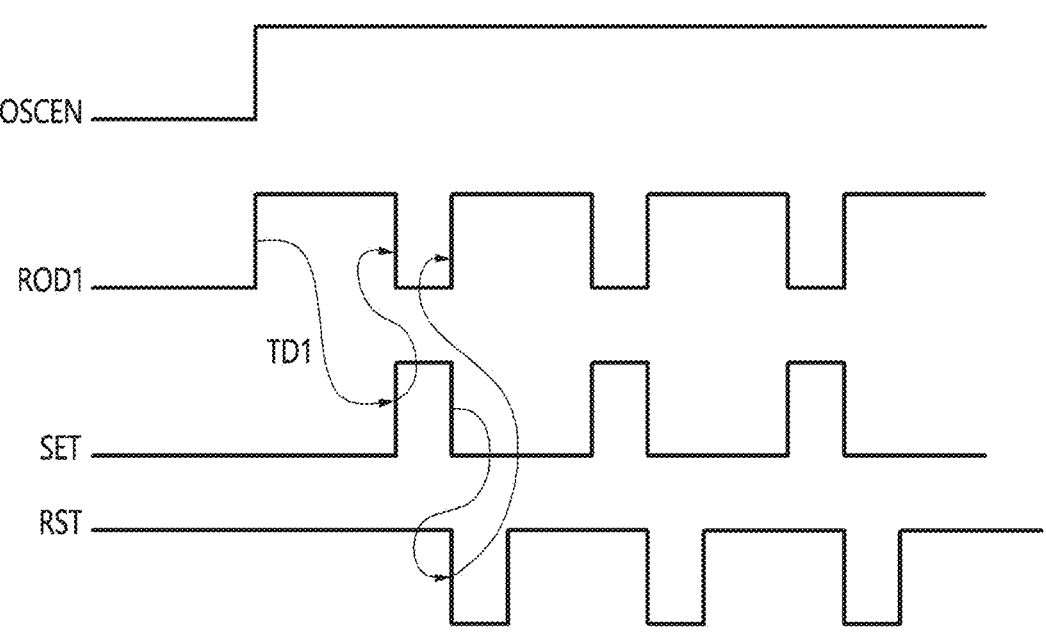
FIG. 11 is a timing diagram illustrating an operation of an oscillating signal generating circuit in accordance with an embodiment.

FIG. 11 is a timing diagram illustrating an operation of the oscillating signal generating circuit 300 in accordance with an embodiment. Referring to FIGS. 8 to 11, when the enable signal OSCEN is enabled, the selection signal SEL may have a first logic level and the oscillating signal generating circuit 300 may generate the oscillating signal ROD through the first clock delaying circuit 311. The first clock delaying circuit 311 may delay the oscillating signal ROD to generate the first output clock signal CLKO1. The selecting circuit 350 may provide the set pulse generator 320 with the first output clock signal CLKO1. The set pulse generator 320 may generate the set pulse signal SET that is enabled to a high logic level when a period of time, corresponding to the delay amount TD1 of the first clock delaying circuit 311, elapses after the oscillating signal ROD transitions from the low logic level to a high logic level. Based on the set pulse signal SET, the oscillating driver 340 may control the oscillating signal ROD to transition from a high logic level to a low logic level. The reset pulse generator 330 may generate the reset pulse signal RST that is enabled to a low logic level when the set pulse signal SET is disabled. Based on the reset pulse signal RST, the oscillating driver 340 may control the oscillating signal ROD to transition from a low logic level to a high logic level. Therefore, a high-level pulse section of the oscillating signal ROD may correspond to the delay amount TD1 of the first clock delaying circuit 311, and a low-level pulse section of the oscillating signal ROD may correspond to the pulse width of the set pulse signal SET.

Figure 12:
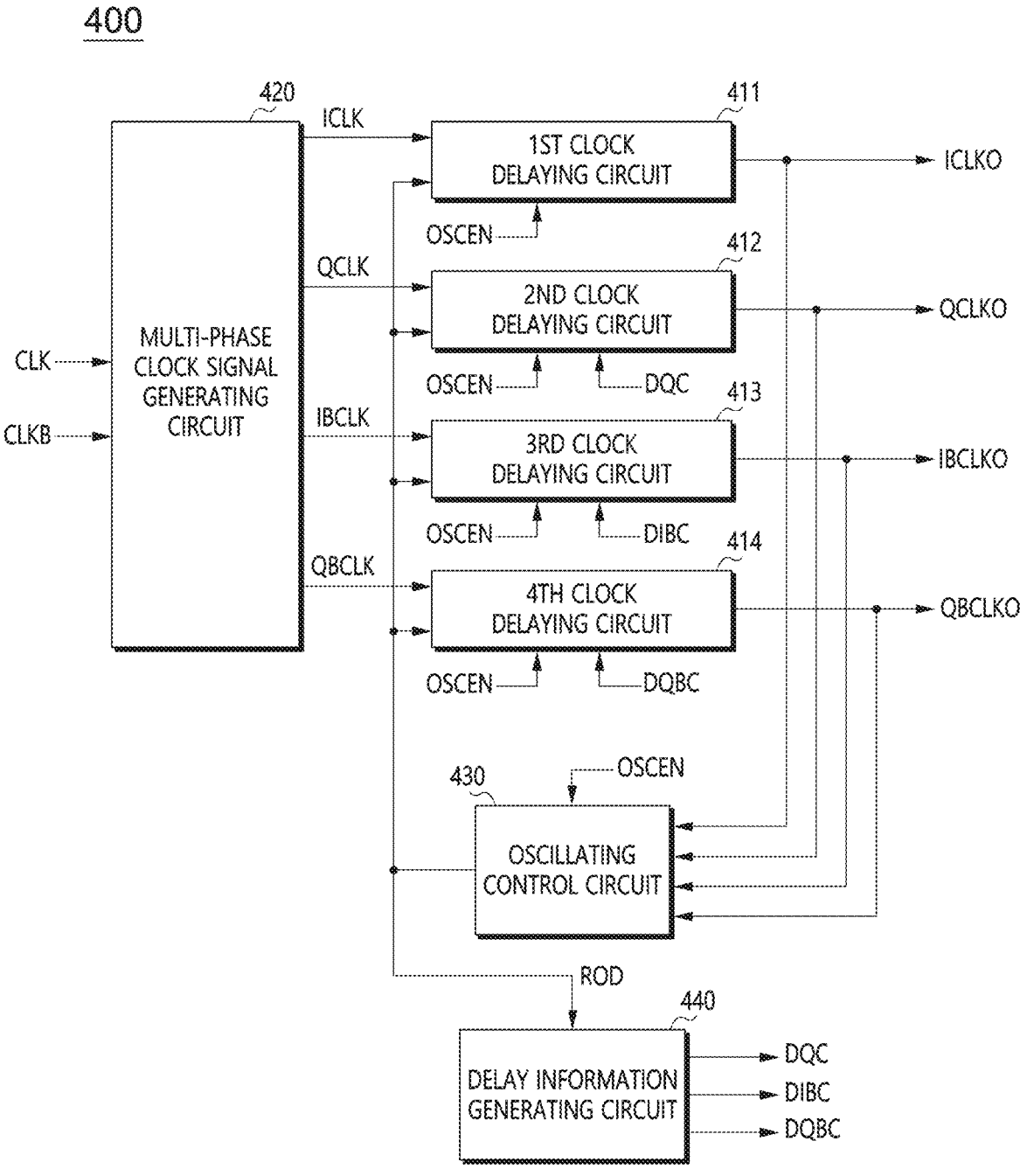
FIG. 12 is a diagram illustrating a configuration of a semiconductor apparatus in accordance with an embodiment.

FIG. 12 is a diagram illustrating a configuration of a semiconductor apparatus 400 in accordance with an embodiment. Referring to FIG. 12, the semiconductor apparatus 400 may include at least two clock delaying circuits, an oscillating control circuit 430, and a delay information generating circuit 440. FIG. 12 illustrates four clock delaying circuits, but the number of clock delaying circuits is not limited thereto. The semiconductor apparatus 400 may include first to fourth clock delaying circuits 411, 412, 413 and 414. The first clock delaying circuit 411 may receive a first phase clock signal ICLK and an oscillating signal ROD to generate a first output clock signal ICLKO. The first clock delaying circuit 411 may delay the first phase clock signal ICLK to generate the first output clock signal ICLKO in a normal mode and may delay the oscillating signal ROD to generate the first output clock signal ICLKO in a compensation mode. The first clock delaying circuit 411 may have a fixed delay amount. In an embodiment, the first clock delaying circuit 411 may have a variable delay amount. The first clock delaying circuit 411 may further receive an enable signal OSCEN. When the enable signal OSCEN is disabled, the first clock delaying circuit 411 may delay the first phase clock signal ICLK to generate the first output clock signal ICLKO. When the enable signal OSCEN is enabled, the first clock delaying circuit 411 may delay the oscillating signal ROD to generate the first output clock signal ICLKO.

The second clock delaying circuit 412 may receive a second phase clock signal QCLK and the oscillating signal ROD to generate a second output clock signal QCLKO. The second clock delaying circuit 412 may delay the second phase clock signal QCLK to generate the second output clock signal QCLKO in the normal mode and may delay the oscillating signal ROD to generate the second output clock signal QCLKO in the compensation mode. The second clock delaying circuit 412 may receive a first delay control signal DQC. A delay amount of the second clock delaying circuit 412 may change based on the first delay control signal DQC. The second clock delaying circuit 412 may further receive the enable signal OSCEN. When the enable signal OSCEN is disabled, the second clock delaying circuit 412 may delay the second phase clock signal QCLK to generate the second output clock signal QCLKO. When the enable signal OSCEN is enabled, the second clock delaying circuit 412 may delay the oscillating signal ROD to generate the second output clock signal QCLKO.

The third clock delaying circuit 413 may receive a third phase clock signal IBCLK and the oscillating signal ROD to generate a third output clock signal IBCLKO. The third clock delaying circuit 413 may delay the third phase clock signal IBCLK to generate the third output clock signal IBCLKO in the normal mode and may delay the oscillating signal ROD to generate the third output clock signal IBCLKO in the compensation mode. The third clock delaying circuit 413 may receive a second delay control signal DIBC. A delay amount of the third clock delaying circuit 413 may change based on the second delay control signal DIBC. The third clock delaying circuit 413 may further receive the enable signal OSCEN. When the enable signal OSCEN is disabled, the third clock delaying circuit 413 may delay the third phase clock signal IBCLK to generate the third output clock signal IBCLKO. When the enable signal OSCEN is enabled, the third clock delaying circuit 413 may delay the oscillating signal ROD to generate the third output clock signal IBCLKO.

The fourth clock delaying circuit 414 may receive a fourth phase clock signal QBCLK and the oscillating signal ROD to generate a fourth output clock signal QBCLKO. The fourth clock delaying circuit 414 may delay the fourth phase clock signal QBCLK to generate the fourth output clock signal QBCLKO in the normal mode and may delay the oscillating signal ROD to generate the fourth output clock signal QBCLKO in the compensation mode. The fourth clock delaying circuit 414 may receive a third delay control signal DQBC. A delay amount of the fourth clock delaying circuit 414 may change based on the third delay control signal DQBC. The fourth clock delaying circuit 414 may further receive the enable signal OSCEN. When the enable signal OSCEN is disabled, the fourth clock delaying circuit 414 may delay the fourth phase clock signal QBCLK to generate the fourth output clock signal QBCLKO. When the enable signal OSCEN is enabled, the fourth clock delaying circuit 414 may delay the oscillating signal ROD to generate the fourth output clock signal QBCLKO.

The first to fourth phase clock signals ICLK, QCLK, IBCLK, and QBCLK may sequentially have a predetermined phase difference between each other. For example, the first phase clock signal ICLK may have a leading phase of 90° to the second phase clock signal QCLK, and the second phase clock signal QCLK may have a leading phase of 90° to the third phase clock signal IBCLK. The third phase clock signal IBCLK may have a leading phase of 90° to the fourth phase clock signal QBCLK, and the fourth phase clock signal QBCLK may have a leading phase of 90° to the first phase clock signal ICLK. The semiconductor apparatus 400 may further include a multi-phase clock signal generating circuit 420. Based on clock signal pair CLK and CLKB, the multi-phase clock signal generating circuit 420 may generate the first to fourth phase clock signals ICLK, QCLK, IBCLK, and QBCLK. The multi-phase clock signal generating circuit 420 may include any clock generating circuit configured to generate a plurality of phase clock signals having a phase difference by correcting a phase of the clock signal pair CLK and CLKB or by dividing a frequency of the clock signal pair CLK and CLKB. For example, the multi-phase clock signal generating circuit 420 may include at least one of a delay locked loop circuit, a phase locked loop circuit, a phase interpolation circuit, and a frequency dividing circuit.

The first to fourth clock delaying circuits 411, 412, 413, and 414 may have substantially the same configuration and may have ideally the same delay amount. However, due to a local process variation and degradation, real delay amounts of the first to fourth clock delaying circuits 411, 412, 413, and 414 may be different from each other. When the delay amounts of the first to fourth clock delaying circuits 411, 412, 413, and 414 are different from each other, it is hard to keep, to 90°, the phase difference between the first to fourth output clock signals ICLKO, QCLKO, IBCLKO, and QBCLKO that are generated from the first to fourth phase clock signals ICLK, QCLK, IBCLK, and QBCLK and therefore reduced will be a valid window or a duration of a signal that is synchronized with the first to fourth output clock signals ICLKO, QCLKO, IBCLKO, and QBCLKO. In order to compensate for a delay amount skew among the first to fourth clock delaying circuits 411, 412, 413, and 414, the semiconductor apparatus 400 may operate in the compensation mode. In the compensation mode, the semiconductor apparatus 400 may monitor the delay amounts of the first to fourth clock delaying circuits 411, 412, 413, and 414 to change the delay amounts of at least the second to fourth clock delaying circuits 412, 413, and 414. For example, the first clock delaying circuit 411 may be a reference delaying circuit and the delay amount of the first clock delaying circuit 411 may be a reference delay amount. The semiconductor apparatus 400 may compare each of the delay amounts of the second to fourth clock delaying circuits 412, 413, and 414 with the delay amount of the first clock delaying circuit 411 to set each delay amount of the second to fourth clock delaying circuits 412, 413, and 414 to be the same as the delay amount of the first clock delaying circuit 411 thereby correcting the delay amount skew among the first to fourth clock delaying circuits 411, 412, 413, and 414. In order to correct the delay amount skew, among the first to fourth clock delaying circuits 411, 412, 413, and 414, the semiconductor apparatus 400 may include the oscillating control circuit 430 and the delay information generating circuit 440.

The oscillating control circuit 430 may receive the first to fourth output clock signals ICLKO, QCLKO, IBCLKO, and QBCLKO respectively from the first to fourth clock delaying circuits 411, 412, 413, and 414. The oscillating control circuit 430 may be sequentially coupled to the first to fourth clock delaying circuits 411, 412, 413, and 414 and may generate the oscillating signal ROD according to the delay amounts of the first to fourth clock delaying circuits 411, 412, 413, and 414. The oscillating control circuit 430 may select one of the first to fourth output clock signals ICLKO, QCLKO, IBCLKO, and QBCLKO and may generate the oscillating signal ROD based on the selected output clock signal. In an embodiment, based on one of the first to fourth output clock signals ICLKO, QCLKO, IBCLKO, and QBCLKO, the oscillating control circuit 430 may control the oscillating signal ROD to transition from a second logic level to a first logic level. Based on a signal that is generated by delaying the oscillating signal ROD by a fixed delay amount, the oscillating control circuit 430 may control the oscillating signal ROD to transition from the first logic level to the second logic level. In an embodiment, the oscillating control circuit 430 may generate the set pulse signal SET based on one of the first to fourth output clock signals ICLKO, QCLKO, IBCLKO, and QBCLKO to control the oscillating signal ROD to transition from the second logic level to the first logic level. The oscillating control circuit 430 may generate the reset pulse signal RST based on the set pulse signal SET to control the oscillating signal ROD to transition from the first logic level to the second logic level. The oscillating control circuit 430 may receive the enable signal OSCEN. The oscillating control circuit 430 may be activated based on the enable signal OSCEN. When the enable signal OSCEN is enabled, the oscillating control circuit 430 may be coupled to one of the first to fourth clock delaying circuits 411, 412, 413, and 414 to generate the oscillating signal ROD. At least a part of the elements within the oscillating signal generating circuits 100, 200, and 300, respectively, illustrated in FIGS. 1, 5, and 8, may be applied as the oscillating control circuit 430. When the oscillating signal generating circuit 100 (see FIG. 1) is applied as the oscillating control circuit 430, the oscillating control circuit 430 may include the selecting circuit 140, the timing control circuit 120, and the oscillating driver 130. When the oscillating signal generating circuit 200 (see FIG. 5) is applied as the oscillating control circuit 430, the oscillating control circuit 430 may include the selecting circuit 240, the first timing control circuit 250, the second timing control circuit 220, and the oscillating driver 230. When the oscillating signal generating circuit 300 (see FIG. 8) is applied as the oscillating control circuit 430, the oscillating control circuit 430 may include the selecting circuit 350, the set pulse generator 320, the reset pulse generator 330, and the oscillating driver 340. However, the selection signal SEL that is provided to control the selecting circuits 140, 240, and 350 may be modified to include multiple bits for selecting one of the first to fourth output clock signals ICLKO, QCLKO, IBCLKO, and QBCLKO.

The delay information generating circuit 440 may be coupled to the oscillating control circuit 430 and may be configured to receive the oscillating signal ROD. Based on the oscillating signal ROD, the delay information generating circuit 440 may generate the first delay control signal DQC, the second delay control signal DIBC, and the third delay control signal DQBC. The delay information generating circuit 440 may generate delay information for each of the first to fourth clock delaying circuits 411, 412, 413, and 414. For example, the delay information generating circuit 440 may be coupled to the first clock delaying circuit 411 and may be configured to generate first delay information based on the oscillating signal ROD that is generated from the first output clock signal ICLKO. The delay information generating circuit 440 may be coupled to the second clock delaying circuit 412 and may be configured to generate second delay information based on the oscillating signal ROD that is generated from the second output clock signal QCLKO. The delay information generating circuit 440 may be coupled to the third clock delaying circuit 413 and may be configured to generate third delay information based on the oscillating signal ROD that is generated from the third output clock signal IBCLKO. The delay information generating circuit 440 may be coupled to the fourth clock delaying circuit 414 and may be configured to generate fourth delay information based on the oscillating signal ROD that is generated from the fourth output clock signal QBCLK. The delay information generating circuit 440 may compare and operate the first delay information with the second to fourth delay information and may generate the first to third delay control signals DQC, DIBC and DQBC according to the results of the comparison and operation, respectively. The delay information generating circuit 440 may compare and operate the second delay information with the first delay information to generate the first delay control signal DQC and may provide the first delay control signal DQC to the second clock delaying circuit 412. The first delay control signal DQC may be generated based on the difference between the second delay information and the first delay information, and the delay amount of the second clock delaying circuit 412 may become substantially the same as the delay amount of the first clock delaying circuit 411 based on the first delay control signal DQC. The delay information generating circuit 440 may compare and operate the third delay information with the first delay information to generate the second delay control signal DIBC and may provide the second delay control signal DIBC to the third clock delaying circuit 413. The second delay control signal DIBC may be generated based on the difference between the third delay information and the first delay information, and the delay amount of the third clock delaying circuit 413 may become substantially the same as the delay amount of the first clock delaying circuit 411 based on the second delay control signal DIBC. The delay information generating circuit 440 may compare and operate the fourth delay information with the first delay information to generate the third delay control signal DQBC and may provide the third delay control signal DQBC to the fourth clock delaying circuit 414. The third delay control signal DQBC may be generated based on the difference between the fourth delay information and the first delay information, and the delay amount of the fourth clock delaying circuit 414 may become substantially the same as the delay amount of the first clock delaying circuit 411 based on the third delay control signal DQBC. The first to third delay control signals DQC, DIBC, and DQBC may be digital signals, each having multiple bits, and may be analogue signals having various voltage levels.

Figure 13:
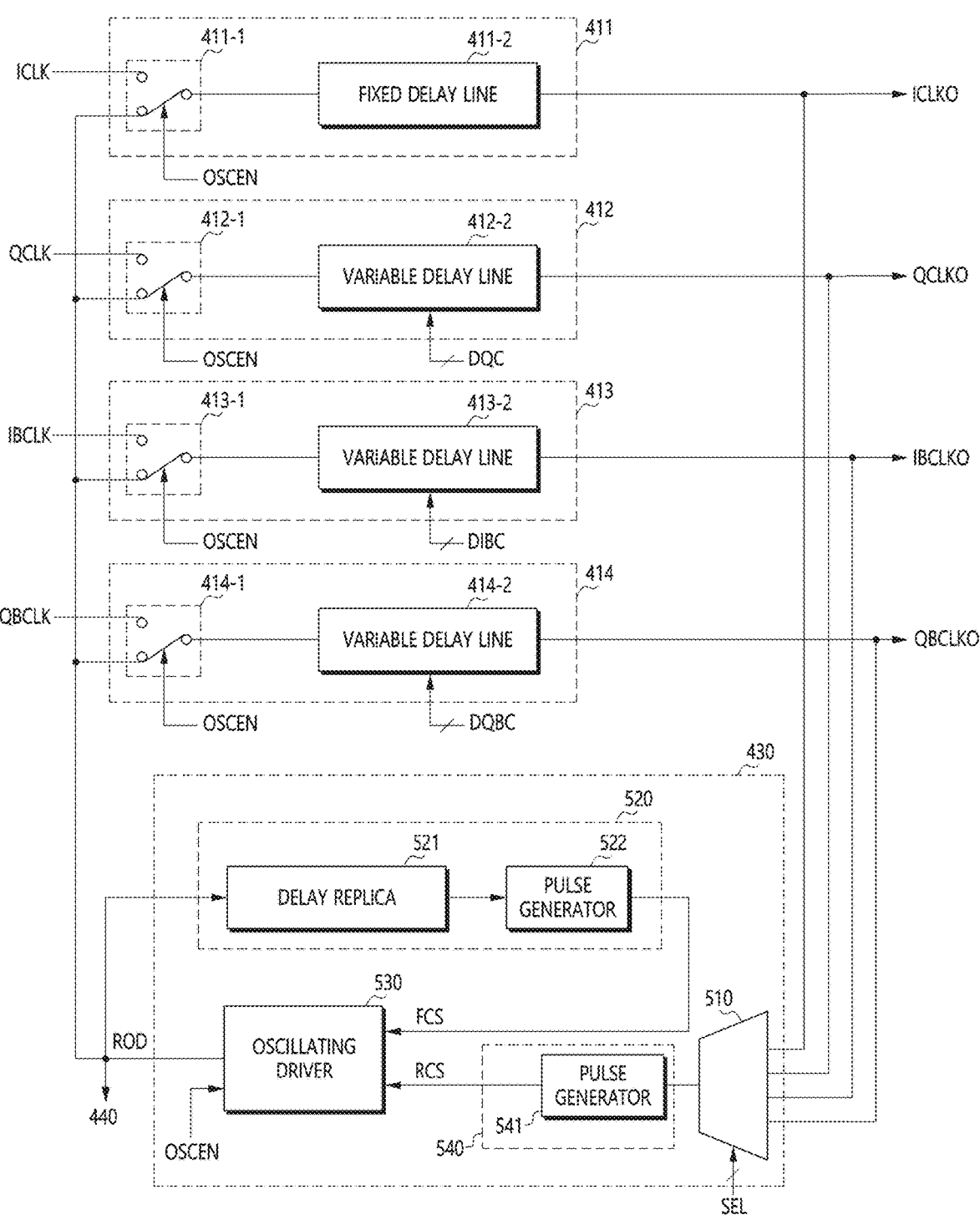
FIG. 13 is a diagram illustrating a connection relationship between a clock delaying circuit and an oscillating control circuit illustrated in FIG. 12.

FIG. 13 is a diagram illustrating a connection relationship between each of the first to fourth clock delaying circuits 411, 412, 413, and 414 and the oscillating control circuit 430, illustrated in FIG. 12. Referring to FIG. 13, the first clock delaying circuit 411 may include a first switch 411-1 and a fixed delay line 411-2. Based on the enable signal OSCEN, the first switch 411-1 may provide the fixed delay line 411-2 with one of the first phase clock signal ICLK and the oscillating signal ROD. The first switch 411-1 may provide the first phase clock signal ICLK to the fixed delay line 411-2 when the enable signal OSCEN is disabled and may provide the oscillating signal ROD to the fixed delay line 411-2 when the enable signal OSCEN is enabled. The fixed delay line 411-2 may have a fixed delay amount. The fixed delay line 411-2 may delay the output signal from the first switch 411-1 to output the first output clock signal ICLKO. In an embodiment, the fixed delay line 411-2 may be substituted with a variable delay line.

The second clock delaying circuit 412 may include a second switch 412-1 and a variable delay line 412-2. Based on the enable signal OSCEN, the second switch 412-1 may provide the variable delay line 412-2 with one of the second phase clock signal QCLK and the oscillating signal ROD. The second switch 412-1 may provide the second phase clock signal QCLK to the variable delay line 412-2 when the enable signal OSCEN is disabled and may provide the oscillating signal ROD to the variable delay line 412-2 when the enable signal OSCEN is enabled. The variable delay line 412-2 may receive the first delay control signal DQC. The delay amount of the variable delay line 412-2 may vary based on the first delay control signal DQC. The variable delay line 412-2 may variably delay the output signal from the second switch 412-1 to output the second output clock signal QCLKO.

The third clock delaying circuit 413 may include a third switch 413-1 and a variable delay line 413-2. Based on the enable signal OSCEN, the third switch 413-1 may provide the variable delay line 413-2 with one of the third phase clock signal IBCLK and the oscillating signal ROD. The third switch 413-1 may provide the third phase clock signal IBCLK to the variable delay line 413-2 when the enable signal OSCEN is disabled and may provide the oscillating signal ROD to the variable delay line 413-2 when the enable signal OSCEN is enabled. The variable delay line 413-2 may receive the second delay control signal DIBC. The delay amount of the variable delay line 413-2 may vary based on the second delay control signal DIBC. The variable delay line 413-2 may variably delay the output signal from the third switch 413-1 to output the third output clock signal IBCLKO.

The fourth clock delaying circuit 414 may include a fourth switch 414-1 and a variable delay line 414-2. Based on the enable signal OSCEN, the fourth switch 414-1 may provide the variable delay line 414-2 with one of the fourth phase clock signal QBCLK and the oscillating signal ROD. The fourth switch 414-1 may provide the fourth phase clock signal QBCLK to the variable delay line 414-2 when the enable signal OSCEN is disabled and may provide the oscillating signal ROD to the variable delay line 414-2 when the enable signal OSCEN is enabled. The variable delay line 414-2 may receive the third delay control signal DQBC. The delay amount of the variable delay line 414-2 may vary based on the third delay control signal DQBC. The variable delay line 414-2 may variably delay the output signal from the fourth switch 414-1 to output the fourth output clock signal QBCLKO.

The oscillating control circuit 430 may include at least a part of the elements included in each of the oscillating signal generating circuits 100 and 200, illustrated in FIGS. 1 and 5. The oscillating control circuit 430 may include a selecting circuit 510, a second timing control circuit 520, and an oscillating driver 530. The selecting circuit 510 may receive the first to fourth output clock signals ICLKO, QCLKO, IBCLKO, and QBCLKO to output, based on the selection signal SEL, one of the first to fourth output clock signals ICLKO, QCLKO, IBCLKO, and QBCLKO. The selecting circuit 510 may provide, as the first control signal RCS, one of the first to fourth output clock signals ICLKO, QCLKO, IBCLKO, and QBCLKO. The oscillating control circuit 430 may further include a first timing control circuit 540. Based on the output signal from the selecting circuit 510, the first timing control circuit 540 may generate the first control signal RCS that is enabled in a pulse form. The first timing control circuit 540 may generate the first control signal RCS based on the edge of the oscillating signal ROD transitioning from the second logic level to the first logic level. The first timing control circuit 540 may enable the first control signal RCS when a period of time, corresponding to the delay amount of one of the first to fourth clock delaying circuits 411, 412, 413, and 414, elapses after the oscillating signal ROD transitions from the second logic level to the first logic level. The first timing control circuit 540 may include a pulse generator 541 configured to generate the first control signal RCS based on the output signal from the selecting circuit 510. The second timing control circuit 520 may receive the oscillating signal ROD and may delay the oscillating signal ROD by a fixed delay amount to generate the second control signal FCS. Based on the oscillating signal ROD, the second timing control circuit 520 may generate the second control signal FCS that is enabled in a pulse form. The second timing control circuit 520 may generate the second control signal FCS based on the edge of the oscillating signal ROD transitioning from the first logic level to the second logic level. The second timing control circuit 520 may enable the second control signal FCS when a period of time, corresponding to the fixed delay amount, elapses after the oscillating signal ROD transitions from the first logic level to the second logic level. The second timing control circuit 520 may include a delay replica 521 and a pulse generator 522. The delay replica 521 may receive the oscillating signal ROD and may delay the oscillating signal ROD by a fixed delay amount. The pulse generator 522 may generate the second control signal FCS based on the output signal from the delay replica 521. The oscillating driver 530 may receive the first control signal RCS and the second control signal FCS and may generate the oscillating signal ROD based on the first control signal RCS and the second control signal FCS. Based on the first control signal RCS, the oscillating driver 530 may control the oscillating signal ROD to transition from the second logic level to the first logic level. Based on the second control signal FCS, the oscillating driver 530 may control the oscillating signal ROD to transition from the first logic level to the second logic level. The oscillating signal ROD may be fed back to the first to fourth clock delaying circuits 411, 412, 413, and 414 and may be provided to the second timing control circuit 520 and the delay information generating circuit 440.

Figure 14:
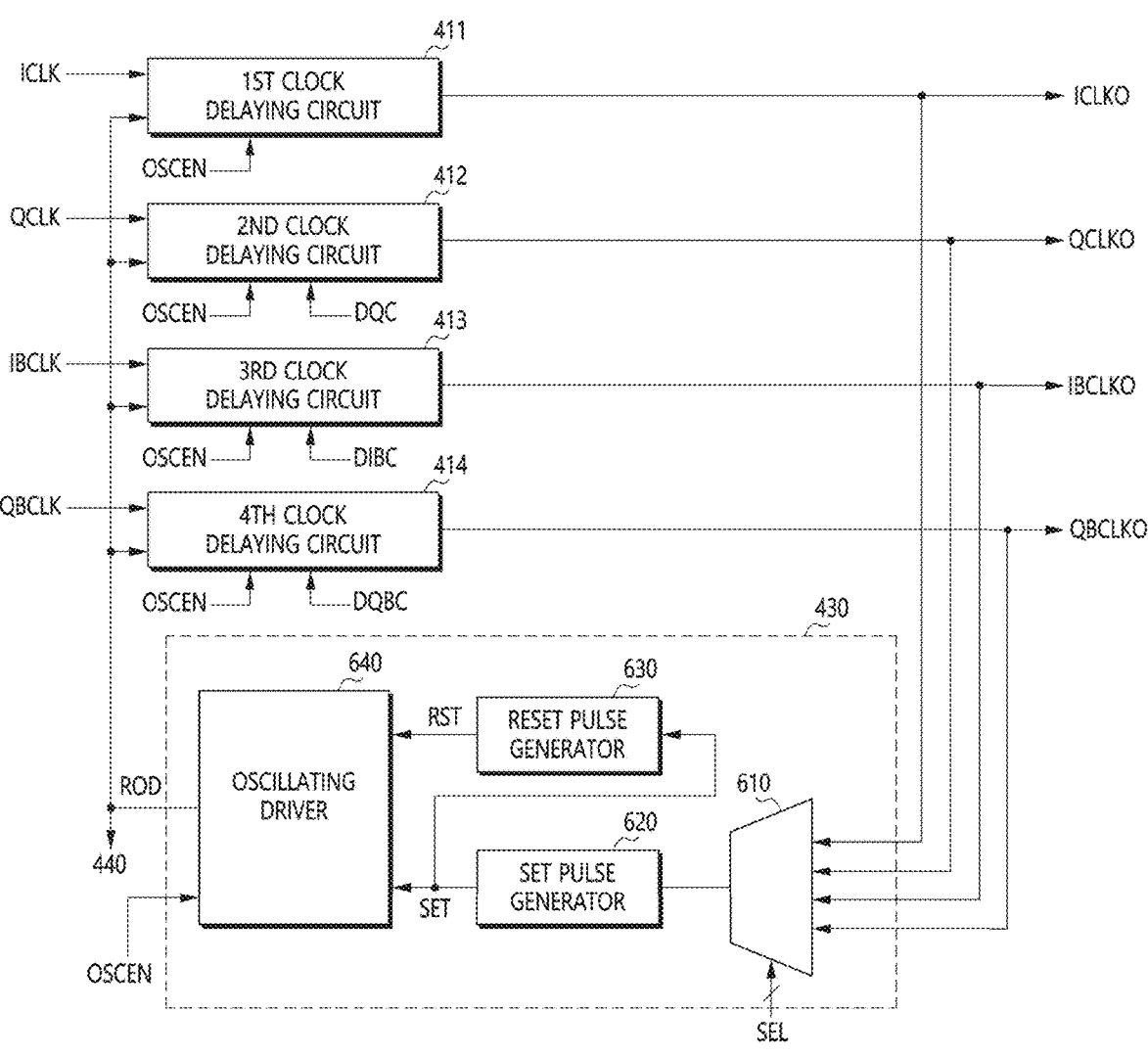
FIG. 14 is a diagram illustrating a connection relationship between a clock delaying circuit and an oscillating control circuit illustrated in FIG. 12.

FIG. 14 is a diagram illustrating a connection relationship between each of the first to fourth clock delaying circuits 411, 412, 413, and 414 and the oscillating control circuit 430, illustrated in FIG. 12. Referring to FIG. 14, the oscillating control circuit 430 may include a selecting circuit 610, a set pulse generator 620, a reset pulse generator 630 and an oscillating driver 640. The selecting circuit 610 may receive the first to fourth output clock signals ICLKO, QCLKO, IBCLKO, and QBCLKO and may output, based on the selection signal SEL, one of the first to fourth output clock signals ICLKO, QCLKO, IBCLKO, and QBCLKO. The set pulse generator 620 may receive the output signal from the selecting circuit 610. The set pulse generator 620 may generate the set pulse signal SET based on the output signal from the selecting circuit 610. The set pulse generator 620 may generate the set pulse signal SET that is synchronized with one of the rising and falling edges of the oscillating signal ROD. For example, the set pulse generator 620 may generate the set pulse signal SET that is synchronized with the rising edge of the oscillating signal ROD. The set pulse generator 620 may enable the set pulse signal SET when a period of time, corresponding to the delay amount of one of the first to fourth clock delaying circuits 411, 412, 413, and 414, elapses after the oscillating signal ROD transitions from the low logic level to the high logic level. The reset pulse generator 630 may receive the set pulse signal SET and may generate the reset pulse signal RST based on the set pulse signal SET. The reset pulse generator 430 may enable the reset pulse signal RST when the set pulse signal SET is disabled. The oscillating driver 640 may receive the set pulse signal SET and the reset pulse signal RST and may generate the oscillating signal ROD based on the set pulse signal SET and the reset pulse signal RST. Based on the set pulse signal SET, the oscillating driver 640 may control the oscillating signal ROD to transition from the second logic level to the first logic level. Based on the reset pulse signal RST, the oscillating driver 640 may control the oscillating signal ROD to transition from the first logic level to the second logic level. The oscillating signal ROD may be fed back to the first to fourth clock delaying circuits 411, 412, 413, and 414 and may be provided to the delay information generating circuit 440.

While certain embodiments have been described above, it will be understood to those skilled in the art that the embodiments described are by way of example only. Accordingly, the oscillating signal generating circuit and a semiconductor apparatus using the same should not be limited based on the described embodiments. Rather, the oscillating signal generating circuit and a semiconductor apparatus using the same described herein should only be limited in light of the claims that follow when taken in conjunction with the above description and accompanying drawings.

What is claimed is:

1. An oscillating signal generating circuit comprising:
   a first clock delaying circuit configured to delay an oscillating signal;

a set pulse generator configured to generate a set pulse signal based on an output from the first clock delaying circuit;
   a reset pulse generator configured to receive the set pulse signal and configured to generate a reset pulse signal; and
   an oscillating driver configured to drive the oscillating signal to a first logic level based on the set pulse signal and configured to drive the oscillating signal to a second logic level based on the reset pulse signal.

2. The oscillating signal generating circuit of claim 1, wherein the set pulse generator is configured to generate the set pulse signal that is synchronized with one of a rising edge and a falling edge of the oscillating signal.

3. The oscillating signal generating circuit of claim 1, wherein the reset pulse signal is enabled when the set pulse signal is disabled.

4. The oscillating signal generating circuit of claim 1, further comprising:
   a second clock delaying circuit configured to delay the oscillating signal; and
   a selecting circuit configured to selectively output one of an output signal from the first clock delaying circuit and an output signal from the second clock delaying circuit based on a selection signal,
   wherein the set pulse generator is configured to generate the set pulse signal based on the output signal from the selecting circuit.

5. The oscillating signal generating circuit of claim 1, wherein the first clock delaying circuit is configured to receive a first input clock signal and to delay the first input clock signal to generate a first output clock signal in a normal mode.

6. The oscillating signal generating circuit of claim 4, wherein the second clock delaying circuit to receive a second input clock signal and to delay the second input clock signal to generate a second output clock signal in a normal mode.

7. An oscillating signal generating circuit comprising:
   a first clock delaying circuit configured to delay an oscillating signal;
   a second clock delaying circuit configured to delay the oscillating signal;
   a selecting circuit configured to output one of an output signal from the first clock delaying circuit and an output signal from the second clock delaying circuit based on a selection signal;
   a set pulse generator configured to generate a set pulse signal based on the output signal from the selecting circuit;
   a reset pulse generator configured to generate a reset pulse signal based on the set pulse signal; and
   an oscillating driver configured to generate the oscillating signal based on the set pulse signal and the reset pulse signal.

8. The oscillating signal generating circuit of claim 7, wherein the set pulse generator is configured to generate the set pulse signal that is synchronized with one of a rising edge and a falling edge of the oscillating signal.

9. The oscillating signal generating circuit of claim 7, wherein the reset pulse signal is enabled when the set pulse signal is disabled.

10. The oscillating signal generating circuit of claim 7, wherein the oscillating driver is configured to drive the oscillating signal to a first logic level based on the set pulse signal and configured to drive the oscillating signal to a second logic level based on the reset pulse signal.

11. The oscillating signal generating circuit of claim 7, wherein the first clock delaying circuit is configured to receive a first input clock signal and to delay the first input clock signal to generate a first output clock signal in a normal mode, and the second clock delaying circuit is configured to receive a second input clock signal and to delay the second input clock signal to generate a second output clock signal in the normal mode.

12. An oscillating signal generating circuit comprising:

a first clock delaying circuit configured to delay an oscillating signal;

a second clock delaying circuit configured to delay the oscillating signal;

a third clock delaying circuit configured to delay the oscillating signal;

a fourth clock delaying circuit configured to delay the oscillating signal;

a selecting circuit configured to output one of output signals from the first to fourth clock delaying circuit based on a selection signal;

a set pulse generator configured to generate a set pulse signal based on the output signal from the selecting circuit;

a reset pulse generator configured to generate a reset pulse signal based on the set pulse signal; and an oscillating driver configured to generate the oscillating signal based on the set pulse signal and the reset pulse signal.

13. The oscillating signal generating circuit of claim 12, wherein the set pulse generator is configured to generate the set pulse signal that is synchronized with one of a rising edge and a falling edge of the oscillating signal.

14. The oscillating signal generating circuit of claim 12, wherein the reset pulse signal is enabled when the set pulse signal is disabled.

15. The oscillating signal generating circuit of claim 12, wherein the oscillating driver is configured to drive the oscillating signal to a first logic level based on the set pulse signal and configured to drive the oscillating signal to a second logic level based on the reset pulse signal.

16. The oscillating signal generating circuit of claim 12, wherein the first clock delaying circuit is configured to receive a first input clock signal and to delay the first input clock signal to generate a first output clock signal in a normal mode, the second clock delaying circuit is configured to receive a second input clock signal and to delay the second input clock signal to generate a second output clock signal in the normal mode, the third clock delaying circuit is configured to receive a third input clock signal and to delay the third input clock signal to generate a third output clock signal in the normal mode, and the second clock delaying circuit is configured to receive a fourth input clock signal and to delay the fourth input clock signal to generate a fourth output clock signal in the normal mode.

\* \* \* \* \*